(12) United States Patent
Otake et al.

(10) Patent No.: US 9,147,622 B2
(45) Date of Patent: Sep. 29, 2015

(54) POWER MODULE SEMICONDUCTOR DEVICE

(71) Applicant: ROHM CO., LTD., Kyoto-shi, Kyoto (JP)

(72) Inventors: Hirotaka Otake, Kyoto (JP); Toshio Hanada, Kyoto (JP)

(73) Assignee: ROHM CO., LTD. (JP)

( * ) Notice: Subject to any disclaimer, the term of this patent is extended or adjusted under 35 U.S.C. 154(b) by 0 days.

(21) Appl. No.: 13/950,904

(22) Filed: Jul. 25, 2013

(65) Prior Publication Data

US 2014/0159054 A1   Jun. 12, 2014

Related U.S. Application Data

(63) Continuation-in-part of application No. PCT/JP2013/063261, filed on May 13, 2013.

(30) Foreign Application Priority Data

May 15, 2012 (JP) ................................. 2012-111274
Jul. 26, 2012 (JP) ................................. 2012-165858

(51) Int. Cl.
| | |
|---|---|
| H01L 29/66 | (2006.01) |
| H01L 23/13 | (2006.01) |
| H01L 23/48 | (2006.01) |
| H01L 25/18 | (2006.01) |
| H01L 29/06 | (2006.01) |
| H01L 29/16 | (2006.01) |
| H01L 29/20 | (2006.01) |
| H01L 25/07 | (2006.01) |
| H01L 23/00 | (2006.01) |

(52) U.S. Cl.
CPC ................ *H01L 23/13* (2013.01); *H01L 23/48* (2013.01); *H01L 24/16* (2013.01); *H01L 24/34* (2013.01); *H01L 24/49* (2013.01); *H01L 25/072* (2013.01); *H01L 25/18* (2013.01); *H01L 29/0603* (2013.01); *H01L 29/1608* (2013.01); *H01L 29/2003* (2013.01); *H01L 24/48* (2013.01); *H01L 2224/48091* (2013.01); *H01L 2224/48227* (2013.01); *H01L 2224/49113* (2013.01); *H01L 2924/00014* (2013.01); *H01L 2924/12032* (2013.01); *H01L 2924/1305* (2013.01); *H01L 2924/1306* (2013.01); *H01L 2924/13055* (2013.01); *H01L 2924/13091* (2013.01); *H01L 2924/30107* (2013.01)

(58) Field of Classification Search
None
See application file for complete search history.

(56) References Cited

U.S. PATENT DOCUMENTS

2010/0013085 A1* 1/2010 Oi et al. ................... 257/693

FOREIGN PATENT DOCUMENTS

| JP | 09-102578 | * | 4/1997 | ............. H01L 25/07 |
| JP | 09102578 A | | 4/1997 | |

(Continued)

OTHER PUBLICATIONS

International Search Report for International Application No. PCT/JP2013/063261; Date of Mailing: Aug. 6, 2013; with English Translation.

*Primary Examiner* — Reema Patel
(74) *Attorney, Agent, or Firm* — Cantor Colburn LLP

(57) ABSTRACT

There is provided a power module semiconductor device allowing reduction in size and weight of a thin type SiC power module. The power module semiconductor device (1) includes: a ceramic substrate (10); a first pattern (D (K4)) of a first copper plate layer (10a) disposed on a surface of the ceramic substrate; a first semiconductor chip (Q4) disposed on the first pattern; a first pillar connection electrode (18$_o$) disposed on the first pattern; and an output terminal (O) connected to the first pillar connection electrode.

29 Claims, 41 Drawing Sheets

(56) References Cited

FOREIGN PATENT DOCUMENTS

| | | | | |
|---|---|---|---|---|
| JP | 09-155457 | * | 1/1999 | ............ H01L 29/78 |
| JP | 11003995 A | | 1/1999 | |
| JP | 2004228403 A | | 8/2004 | |
| JP | 2005183463 A | | 7/2005 | |
| JP | 2007305962 A | | 11/2007 | |
| JP | 2009065097 A | | 3/2009 | |
| JP | 2012004226 A | | 1/2012 | |
| JP | 2012089681 A | | 5/2012 | |

* cited by examiner

POWER MODULE SEMICONDUCTOR DEVICE

CROSS REFERENCE TO RELATED APPLICATIONS

This is a continuation-in-part (CIP) of PCT Application No. PCT/JP2013/63261, filed on May 13, 2013, which claims priority to Japan Patent Application No. P2012-111274 filed on May 15, 2012 and is based upon and claims the benefit of priority from prior Japanese Patent Application No. P2012-111274 filed on May 15, 2012, prior Japanese Patent Application No. P2012-165858 filed on Jul. 26, 2012 and PCT Application No. PCT/JP2013/63261, filed on May 13, 2013, the entire contents of each of which are incorporated herein by reference.

TECHNICAL FIELD

The present invention relates to a power module semiconductor device, and in particular relates a power module semiconductor device allowing reduction in size and weight.

BACKGROUND ART

Many research institutions are currently conducting research to develop Silicon Carbide (SiC) devices. Advantages of SiC power devices over Si power devices include low on resistance, high switching speed, high temperature operation, etc.

Conventional Si power devices, such as Insulated Gate Bipolar Transistors (IGBTs), are limited to about 150 degrees C. maximum operating temperature.

However, SiC based devices can theoretically operate to temperatures of 600 degrees C.

In conventional Si power modules, since losses produced by Si power devices are relatively larger, high power cannot be output due to a problem of heat generation. Since high thermal resistance of power modules can be tolerated in instead of inability to output high power, the thickness of power modules were increased in consideration of an influence of warpage, thereby reaching the limits of miniaturization of power modules.

SiC power modules can conduct a large electric current, and can be easily operated under high temperature conditions operation, since losses produced by Si power devices are relatively smaller. However, thin type power module design has been required for achieving such SiC power modules.

Case type packages is used as packages of the SiC power devices.

On the other hand, there is also disclosed a semiconductor device which is resin-sealed by transfermold technique (Refer to Patent Literature 1, for example).

Moreover, there is also disclosed a structure of SiC power devices in which wire bonding technique is applied for a source electrode (Refer to Patent Literature 2, for example).

CITATION LIST

Patent Literature 1: Japanese Patent Application Laying-Open Publication No. 2005-183463
Patent Literature 2: Japanese Patent Application Laying-Open Publication No. 2007-305962

SUMMARY OF INVENTION

Technical Problem

Since conventional Si power modules were of high normalized on resistance, the chip size was increased in order to reduce the resistance, and therefore an area of the whole module was also increased. Therefore, since warpage of modules easily occurred, the thickness of a substrate to be included therein was increased in order to reduce such warpage, and the thickness of the whole module was also increased due to a design limitation. Moreover, conventional Si power modules were not able to operate under high temperature conditions due to a property in which Si devices exhibit thermal run away under such high temperature conditions.

Thin type power modules have been required in respect of miniaturization of SiC power modules. In SiC power modules, since the chip area of SiC devices is smaller, thermal resistance is not sufficiently reduced, and since high temperature operation is also required, there is a problem of warpage of structural members used for thin type power modules.

Moreover, in conventional semiconductor modules, there were many structural members to be included therein, and therefore reduction in the size of modules was deficient. Moreover, since terminals to be mounted in systems were not optimally placed thereon, it was not able to achieve space saving. Moreover, since it is necessary to enlarge the thickness between an upper surface plate electrode and a substrate in order to avoid a short-circuit between bonding wires and structural members to be included therein, reduction in the size of modules was deficient.

The object of the present invention is to provide a power module semiconductor device allowing reduction in size and weight of a thin type SiC power module.

Solution to Problem

According to one aspect of the present invention for achieving the above-mentioned object, there is provided a power module semiconductor device comprising: a ceramic substrate; a first pattern of a first copper plate layer disposed on a surface of the ceramic substrate; a first semiconductor chip disposed on the first pattern; a first pillar connection electrode disposed on the first pattern; and an output terminal connected to the first pillar connection electrode.

Advantageous Effects of Invention

According to the present invention, there can be provided the power module semiconductor device allowing reduction in size and weight of the thin type SiC power module.

DESCRIPTION OF EMBODIMENTS

Figure 1:
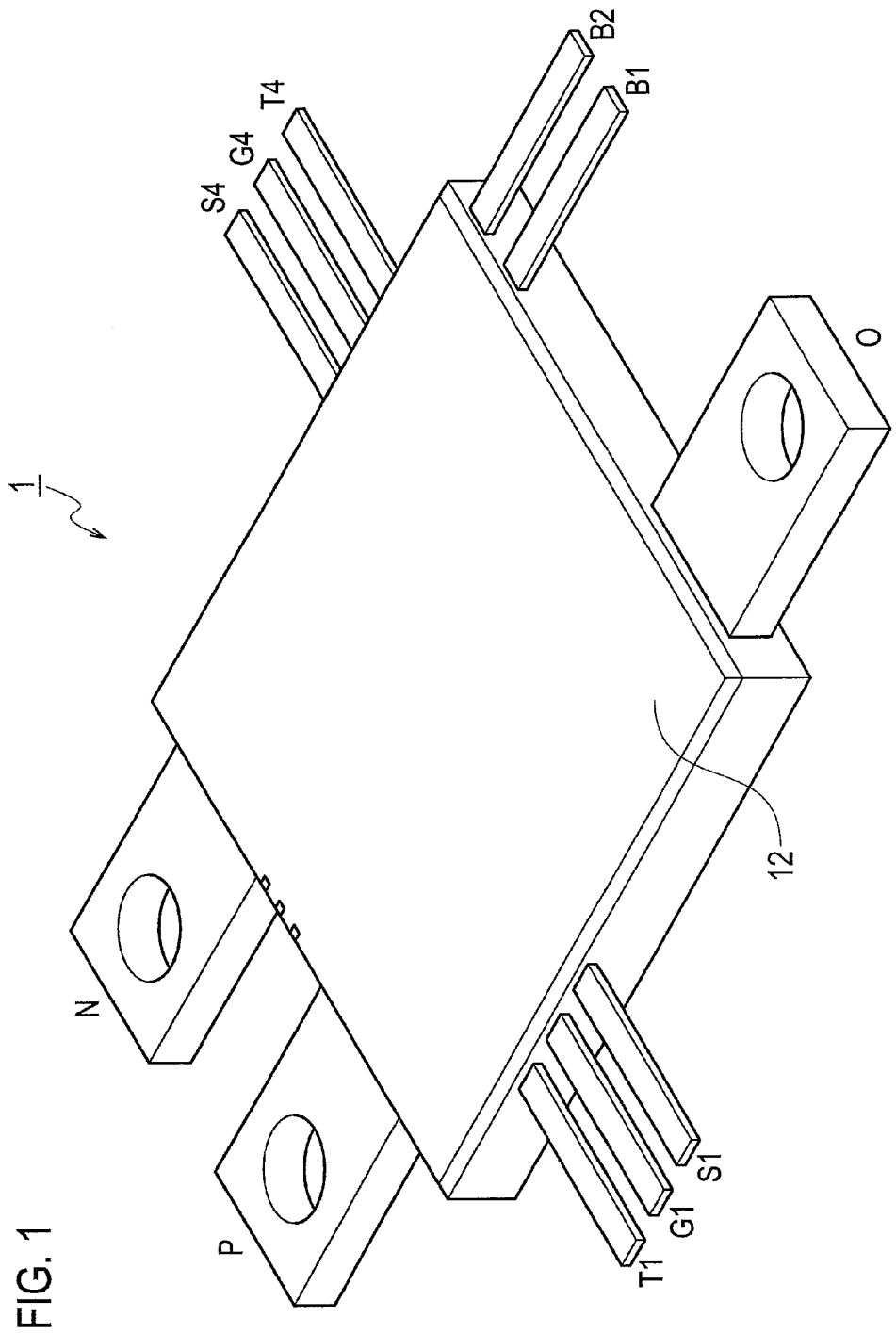
FIG. 1 is a schematic bird's-eye view configuration diagram showing a 2-in-1 module, which is a power module semiconductor device according to a first embodiment.

Next, certain embodiments of the invention will be described with reference to drawings. In the description of the following drawings, the identical or similar reference numeral is attached to the identical or similar part. However, it should be noted that the drawings are schematic and the relation between thickness and the plane size and the ratio of the thickness of each layer differs from an actual thing. Therefore, detailed thickness and size should be determined in consideration of the following explanation.

Of course, the part from which the relation and ratio of a mutual size differ also in mutually drawings is included. Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

First Embodiment (Configuration of Semiconductor Device)

FIG. 1 illustrates a schematic bird's-eye view configuration of a 2-in-1 module, which is a power module semiconductor device 1 according to a first embodiment.

Figure 2:
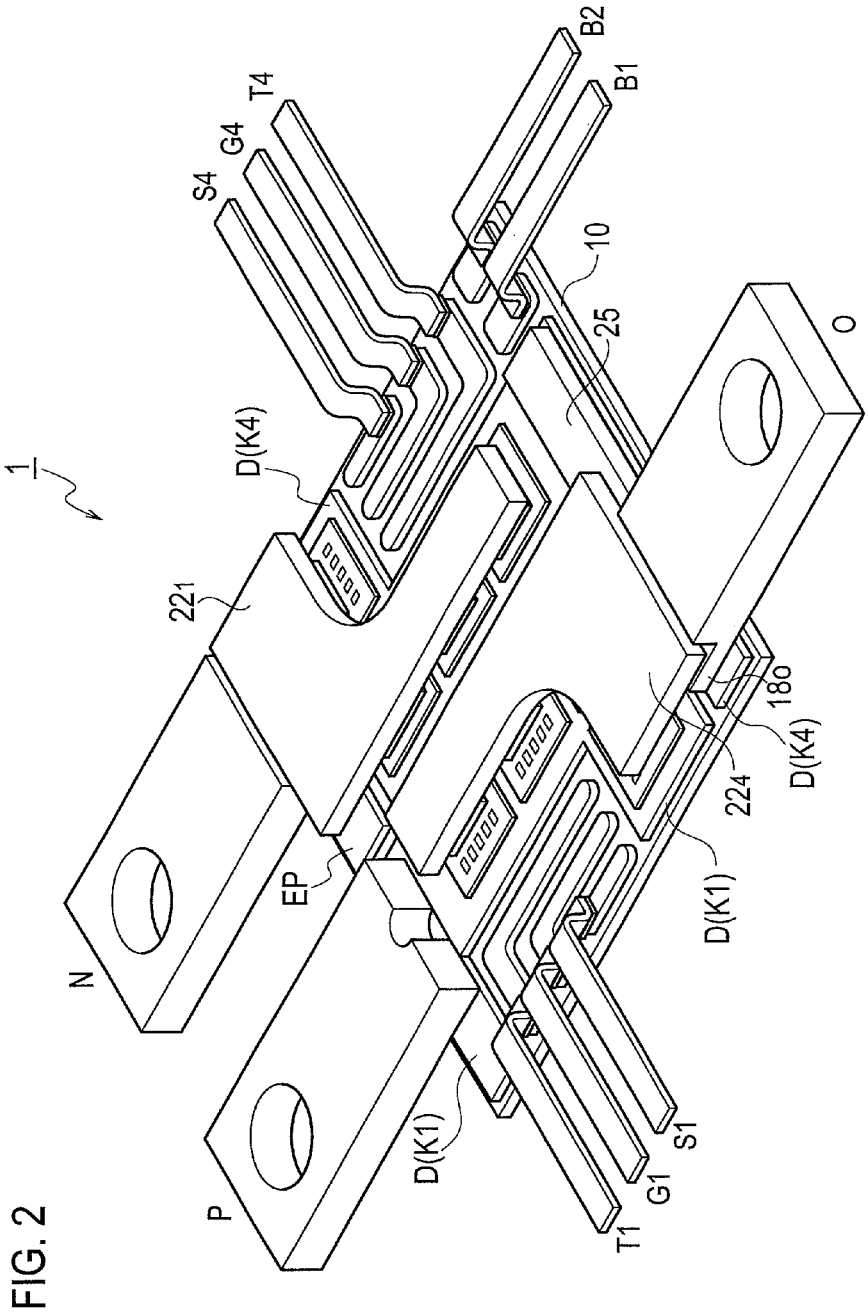
FIG. 2 is a schematic bird's-eye view configuration diagram showing the 2-in-1 module, which is the power module semiconductor device according to the first embodiment, before forming a resin layer thereon.

Moreover, FIG. 2 illustrates a schematic bird's-eye view configuration of the power module semiconductor device 1 before forming a resin layer 12 thereon.

As shown in FIGS. 1 and 2, the power module semiconductor device 1 according to the first embodiment includes: a positive side power input terminal P and a negative side power input terminal N disposed on a first side of a ceramic substrate 10 covered with a resin layer 12; a group of signal terminals S1, G1, T1 disposed on a second side adjacent to the first side; an output terminal O and thermistor connecting terminals B1, B2 disposed on a third side opposite to the first side; and a group of signal terminals S2, G2, T2 disposed on a fourth side opposite to the second side. In this case, the signal terminals S1, G1, T1 respectively correspond to a source sense terminal, a gate signal terminal, and a current sense terminal of a semiconductor chip Q1 shown in FIG. 12, and the signal terminals S2, G2, T2 respectively correspond to a source sense terminal, a gate signal terminal, and a current sense terminal of a semiconductor chip Q4 shown in FIG. 12. Moreover, the negative side power input terminal N corresponds to a first power input terminal, and the positive side power input terminal P corresponds to a second power input terminal.

Figure 3:
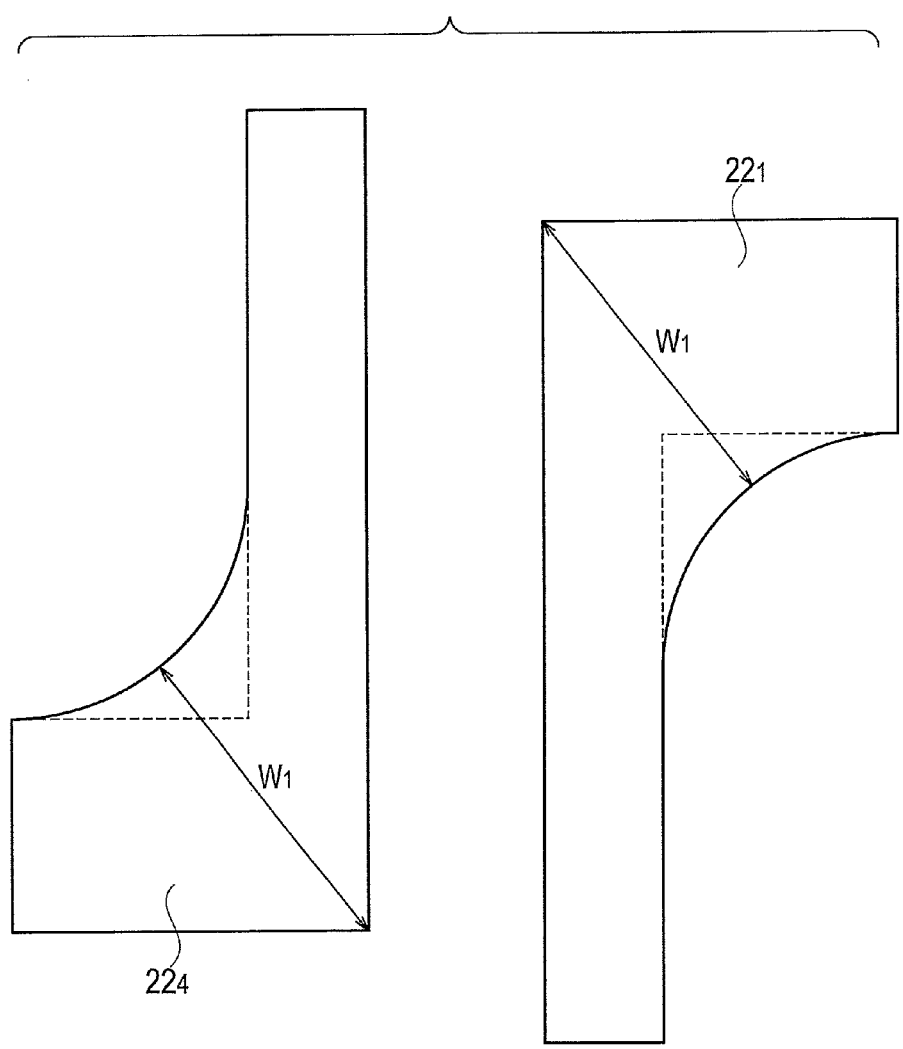
FIG. 3 is a schematic planar pattern configuration diagram showing an upper surface plate electrode applied to the power module semiconductor device according to the first embodiment.

Moreover, FIG. 3 illustrates a schematic planar pattern configuration of upper surface plate electrodes $22_1$, $22_4$ applied to the power module semiconductor device 1 according to the first embodiment.

Furthermore, FIG. 4A illustrates a schematic bird's-eye view configuration of the power module semiconductor device 1, before forming the upper surface plate electrodes $22_1$, $22_4$ thereon.

Figure 5:
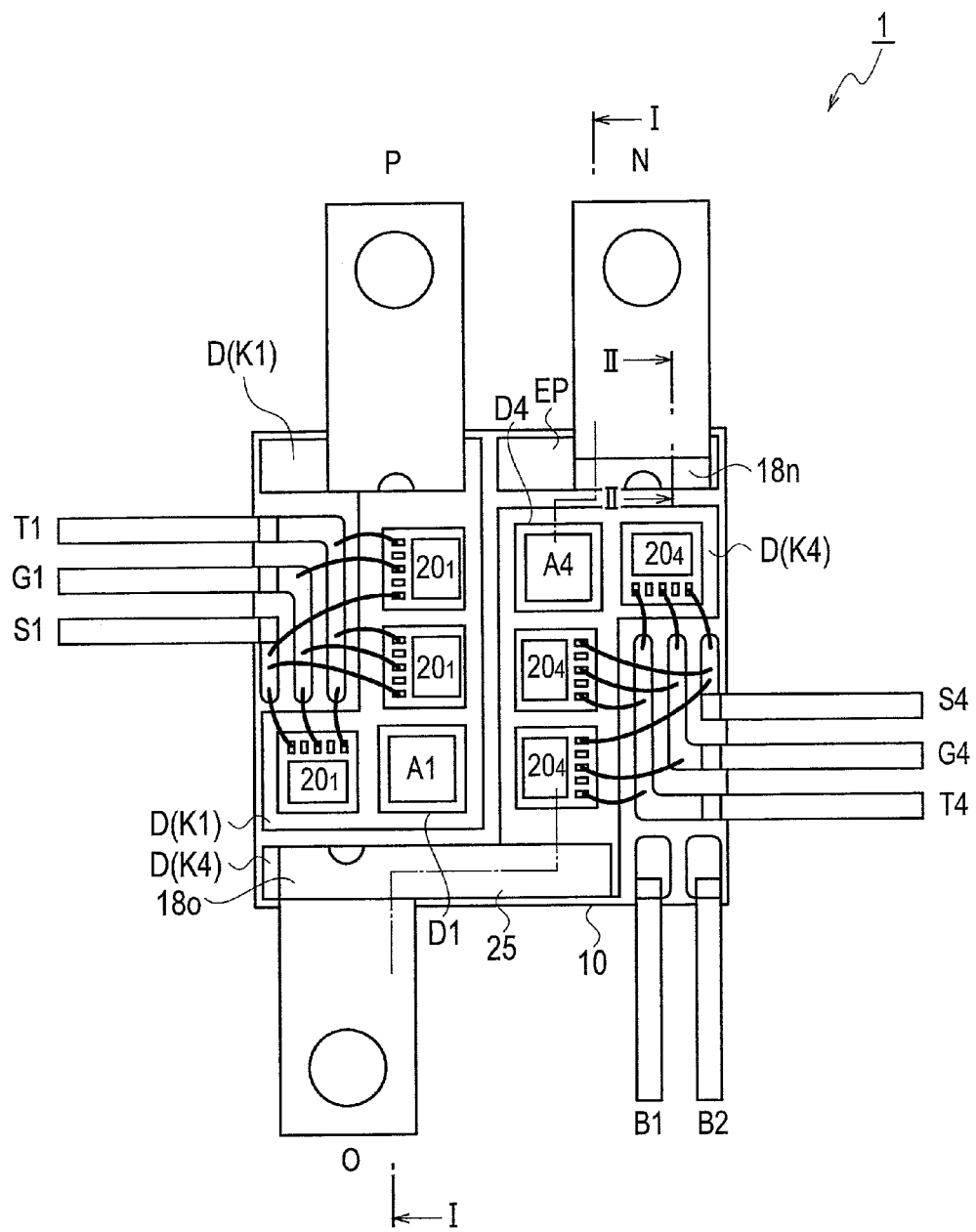
FIG. 5 is a schematic planar pattern configuration diagram showing the 2-in-1 module, which is a power module semiconductor device according to the first embodiment.
Figure 6:
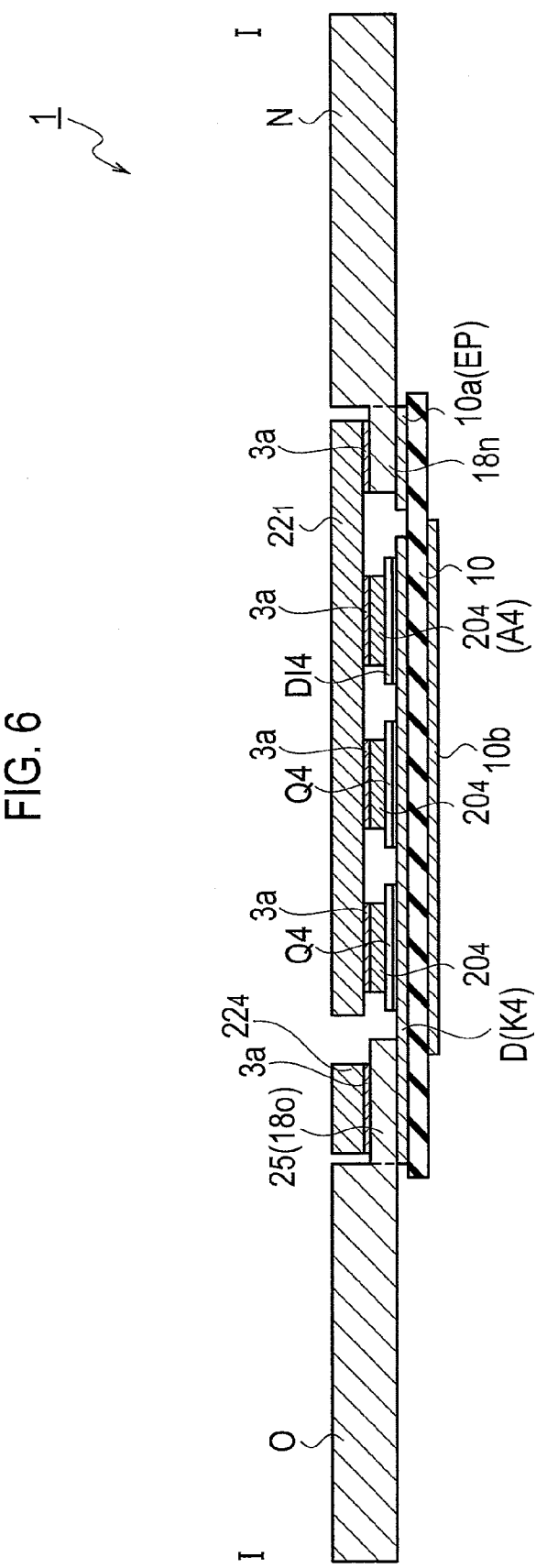
FIG. 6 is a schematic cross-sectional structure diagram taken in the line I-I of FIG. 5.

Moreover, FIG. 5 illustrates a schematic planar pattern configuration of a 2-in-1 module, which is the power module semiconductor device 1 according to the first embodiment. FIG. 6 illustrates a schematic cross-sectional structure taken in the line I-I of FIG. 5.

Figure 12:
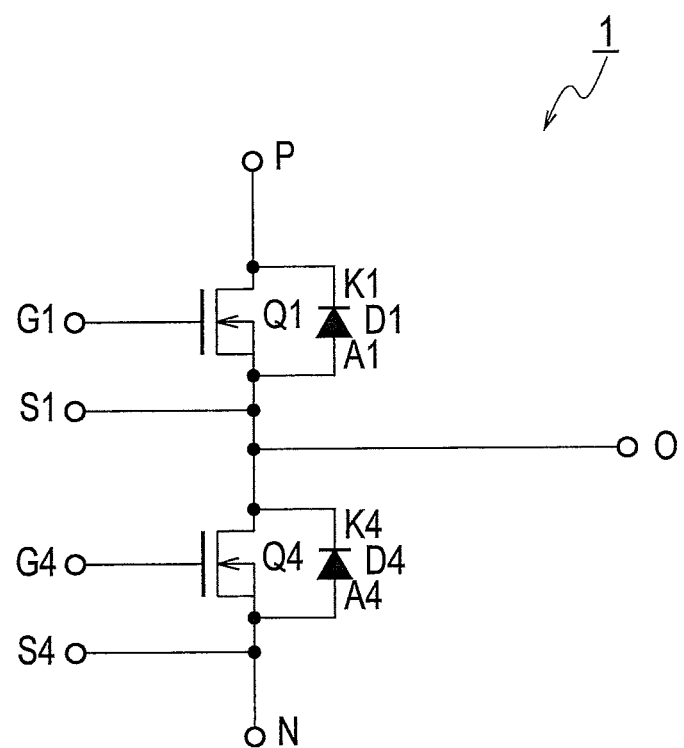
FIG. 12 is a schematic circuit representative diagram showing the 2-in-1 module, which is the power module semiconductor device according to the first embodiment.

FIG. 12 illustrates a schematic circuit representative of the 2-in-1 module, which is the power module semiconductor device 1 according to the first embodiment.

The power module semiconductor device 1 according to the first embodiment is configured with the 2-in-1 module. More specifically, two Metal-Oxide-Semiconductor Field Effect Transistors (MOSFETs) Q1, Q4 are included in one module.

As an example, four chips (MOS transistor×3, diode×1) can be mounted in one side of the 2-in-1 module, and a maximum of three pieces of the MOSFETs Q1, Q4 respectively can be connected to one another in parallel.

As shown in FIGS. 1-6, the power module semiconductor device 1 according to the first embodiment includes, in an SiC Transfer mold Power Module (TPM), a negative side power input terminal N and an output terminal O which are also equipped with a function of pillar connection electrodes $18_o$, $18_n$ which electrically connect the upper surface plate electrodes $22_1$, $22_4$ to electrode patterns (EP, D(K4)) on the ceramic substrate 10. The negative side power input terminal N and the output terminal O also function as a power terminal. As shown in FIG. 2, a pillar extended electrode 25 may be connected to the pillar connection electrode $18_o$.

In the power module semiconductor device 1 according to the first embodiment, as shown in FIGS. 1-6, the group of signal terminals (G1, S1, T1) and the group of signal terminals (G4, S4, T4) at the mutually opposite sides are alternately disposed, in a structure in which any one of the group of signal terminals (G1, S1, T1) and the group of signal terminals (G4, S4, T4), or the positive side power input terminal P, the negative side power input terminal N, and the output terminal O projected from all four sides (all side surfaces) of the package module.

Moreover, in the power module semiconductor device 1 according to the first embodiment, as shown in FIG. 5, the upper surface plate electrodes $22_1$, $22_4$ are disposed so as to not cover bonding wires extended from the semiconductor chip.

The power module semiconductor device 1 according to the first embodiment includes the negative side power input terminal N and the output terminal O which are also equipped with the function of the pillar connection electrodes $18_o$, $18_n$ which electrically connect the upper surface plate electrodes $22_1$, $22_4$ to the electrode patterns (EP, D(K4)) on the ceramic substrate 10. Accordingly, since the number of structural members can be reduced, the power module size can be reduced, thereby improving a power density of the power module. Consequently, reduction of a manufacturing cost can be achieved.

Moreover, in the power module semiconductor device 1 according to the first embodiment, since the group of signal terminals (G1, S1, T1) and the group of signal terminals (G4, S4, T4) at the mutually opposite sides are alternately disposed, the group of signal terminals (G1, S1, T1) and the group of signal terminals (G4, S4, T4) are not contacted with respect to each other even when the power modules are arranged in parallel to one another in the case of assembling a three-phase inverter circuit, thereby achieving space-saving of the power module size.

Moreover, in the power module semiconductor device 1 according to the first embodiment, since the upper surface plate electrodes $22_1$, $22_4$ are disposed so as to not cover the bonding wires extended from the semiconductor chip, the design of the pillar connection electrodes $18_o$, $18_n$, the pillar extended electrode 25, and the pillar electrodes $20_1$, $20_4$ is restricted to existence of the bonding wires.

Accordingly, each height of the pillar connection electrodes $18_o$, $18_n$, the pillar extended electrode 25, and the pillar electrodes $20_1$, $20_4$ can be relatively reduced compared with a structure in which the upper surface plate electrodes $22_1$, $22_4$ are disposed directly above the bonding wires extended from the chips of the semiconductor chips Q1, Q4. As a consequence, cost reduction of structural members composing the power module can be achieved.

According to the power module semiconductor device 1 according to the first embodiment, the number of structural members can be reduced, thereby increasing the number of the chips.

Techniques, e.g. solder bonding, metallic bonding using metallic particles, solid phase diffusion bonding, and transient liquid phase (TLP) bonding, are applicable to form a bonded structure of each structural member.

For example, a metallic bonded structure is formed by annealing paste materials containing conductive particles. The annealing temperature of paste materials is approximately 200-400 degrees C., for example. The conductive particles are metallic fine particles which are silver particles, gold particles, or nickel particles, copper particles, etc., for example. As an example, if the silver particles are applied as metallic fine particles, the cardinalities of the silver particles are from approximately 80 mass % to approximately 95 mass %, for example. Moreover, an average particle diameter of the silver nanoparticles is from approximately 10 nm to approximately 100 nm.

The output terminal O is connected to the positive side power input terminal P via the MOSFET Q1, and is connected to the negative side power input terminal N via the MOSFET Q4. In this case, the output terminal O also functions as the pillar connection electrode $18_o$ and the pillar extended electrode 25, and the negative side power input terminal N also functions as the pillar connection electrode $18_n$.

The positive side power input terminal P without a pillar electrode structure is directly connected to the third pattern D(K1). However, the positive side power input terminal P may be also equipped with the pillar electrode structure in the same manner as the negative side power input terminal N.

As shown in FIGS. 1-6, the power module semiconductor device 1 according to the first embodiment includes: a ceramic substrate 10; a first pattern D(K4) of a first copper plate layer 10a disposed on a surface of the ceramic substrate 10; a semiconductor chip Q4 disposed on the first pattern D(K4); a first pillar connection electrode $18_o$ disposed on the first pattern D(K4); and an output terminal O connected to the first pillar connection electrode $18_o$.

Moreover, the power module semiconductor device 1 may include: a second pattern EP of the first copper plate layer 10a; a second pillar connection electrode $18_n$ disposed on the second pattern EP; and a negative side power input terminal N connected to the second pillar connection electrode $18_n$.

Moreover, the first pillar connection electrode $18_o$ may include a pillar extended electrode 25 disposed on the first pattern D(K4). In particular, since the width of the first pattern D(K4) portion on which the first pillar connection electrode $18_o$ is disposed is formed narrowly, the value of resistance is easily increased. Since the value of resistance is placed between the drain and the output terminal O of the semiconductor chip Q4, it contributes to a parasitic series resistance and a parasitic series inductance which are connected to the drain of the semiconductor chip Q4. The pillar extended electrode 25 is disposed on the first pattern D(K4), thereby reducing such a parasitic series resistance and a parasitic series inductance.

Moreover, the power module semiconductor device 1 may include a first pillar electrode $20_4$ disposed on the semiconductor chip Q4.

Moreover, the power module semiconductor device 1 may include a first diode D4 disposed on the first pattern D(K4) so as to be adjacent to the semiconductor chip Q4.

Moreover, the power module semiconductor device 1 may include a first upper surface plate electrode 221 disposed on the first pillar electrode $20_4$, and connected to the anode electrode A4 of the first diode D4.

Moreover, the power module semiconductor device 1 may include a semiconductor chip Q1 disposed on the third pattern D(K1) of the first copper plate layer 10a.

Moreover, the power module semiconductor device 1 may include a second diode D1 disposed on the third pattern D(K1) so as to be adjacent to the semiconductor chip Q1.

Moreover, the power module semiconductor device 1 may include a second pillar electrode $20_1$ disposed on the semiconductor chip Q1.

Moreover, the power module semiconductor device 1 may include a second upper surface plate electrode $22_4$ disposed on the second pillar electrode $20_1$, and connected to the anode electrode A4 of the second diode D1.

As shown in FIGS. 2 and 3, the first upper surface plate electrode $22_1$ and the second upper surface plate electrode $22_4$ are preferable to have a curved concave L-shaped structure in an inside corner portion in planar view. It is for the purpose of reducing the electric resistance, avoiding contact with the bonding wires. In particular, as shown in FIG. 3, the minimum distance between the corner portion and the curved portion in the L-shaped structure is set as W1.

Moreover, the power module semiconductor device 1 according to the first embodiment may include a positive side power input terminal P connected to the third pattern D(K1).

Moreover, as shown in FIG. 5, the power module semiconductor device 1 according to the first embodiment include: a first group of signal terminals (S4, G4, T4) disposed on a fourth side of the ceramic substrate 10, and connected to the semiconductor chip Q4 via a first group of bonding wires; and a second group of signal terminals (S1, G1, T1) disposed on a second side opposite to the fourth side of the ceramic substrate 10, and connected to the semiconductor chip Q1 via a second group of bonding wires. In this case, the first group of signal terminals (S4.G4.T4) and the second group of signal terminals (S1.G1.T1) are alternately disposed with respect to each other.

Moreover, the first group of signal terminals (S4, G4, T4) and the second group of signal terminals (S1, G1, T1) may include an L-shaped structure as shown in FIGS. 2, 5 and 6.

Figure 4:
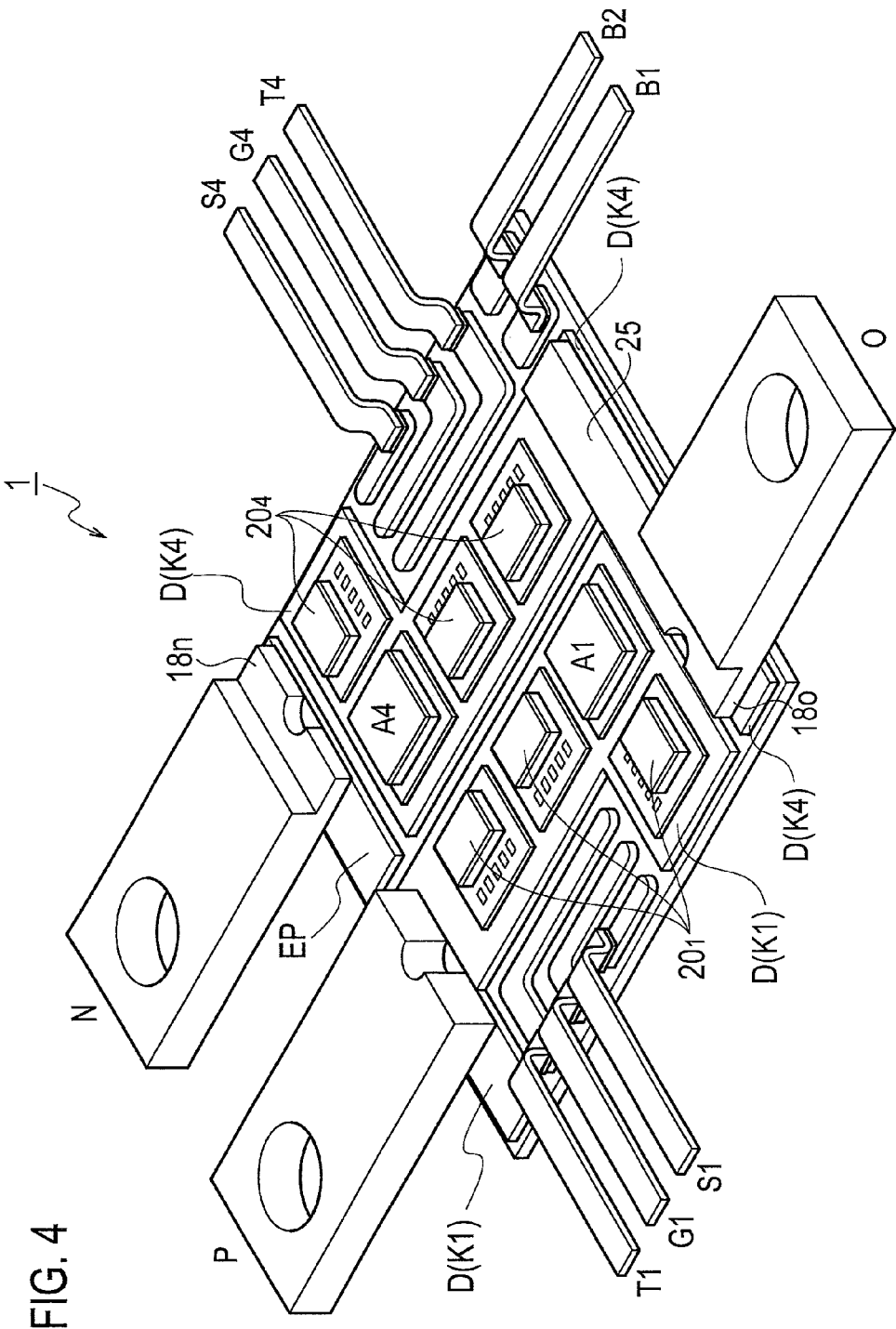
FIG. 4 is a schematic bird's-eye view configuration diagram showing the 2-in-1 module, which is the power module semiconductor device according to the first embodiment, before forming the upper surface plate electrode thereon.

Furthermore, as shown in FIGS. 2, 4 and 5, the first upper surface plate electrode $22_1$ is disposed so as to not cover the first group of bonding wires extended from the semiconductor chip Q4, and the second upper surface plate electrode $22_4$ is also disposed so as to not cover the second group of bonding wires extended from the semiconductor chip Q1, in planar view observed from the thickness direction of the ceramic substrate 10.

Since the group of signal terminals (G1, S1, T1) and the group of signal terminals (G4, S4, T4) are formed in the L-shaped form, it becomes possible to and to wire the bonding wires from the 3-chip MOS transistor in a shorter distance without cross-wiring, and the upper surface plate electrodes $22_1$, $22_4$ can also be disposed so as to not cover the bonding wires extended from the chips of the semiconductor chips Q1, Q4.

Although the parasitic inductance increases because the upper surface plate electrodes 221, 224 have such an L-shaped structure, an extension portion for the purpose of increasing the cross-sectional area of the upper surface plate electrodes $22_1$, $22_4$ may be separately formed as measures against such a departure problem. In this case, the extension portion is provided with a configuration for the purpose of increasing the width or the thickness of the upper surface plate electrodes $22_1$, $22_4$.

Moreover, as shown in FIGS. 2, 5 and 6, the semiconductor chip Q4, the first diode D4, the first upper surface plate electrode $22_4$, and the first group of signal terminals (S4, G4, T4); and the semiconductor chip Q1, the second diode D1, the second upper surface plate electrode $22_4$, and the second group of signal terminals (S1, G1, T1) are observed from a thickness direction of a ceramic substrate 10 may be disposed so as to be symmetrical with respect to a point of the center of the ceramic substrate 10 in planar view.

Moreover, as shown in FIG. 6, the output terminal O, the negative side power input terminal N, the first upper surface plate electrode 221, and the second upper surface plate electrode 224 can be disposed so as to be flush with one another.

Figure 7:
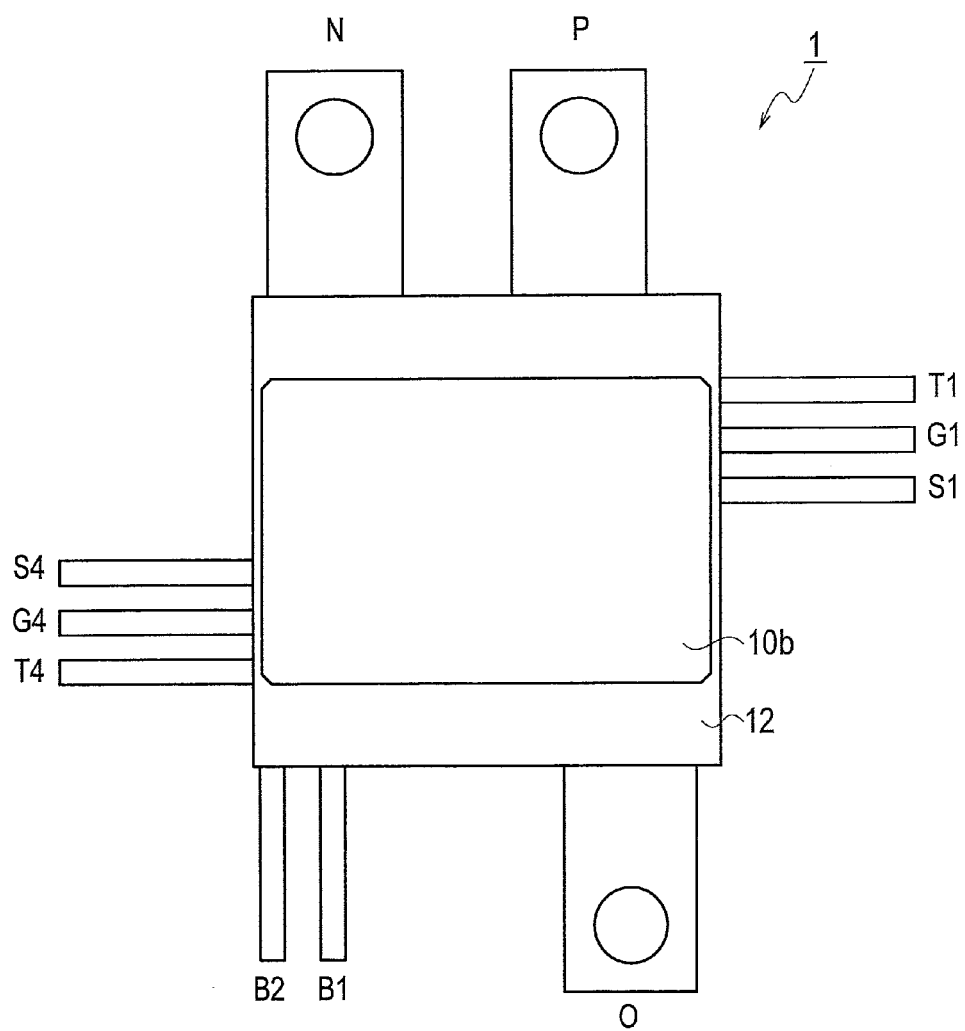
FIG. 7 is a schematic back side external configuration diagram showing the 2-in-1 module, which is a power module semiconductor device according to the first embodiment.

FIG. 7 illustrates a schematic back side external appearance configuration of a 2-in-1 module, which is the power module semiconductor device 1 according to the first embodiment. The second copper plate layer 10b disposed on the back side surface of the ceramic substrate 10 also functions as a heat spreader.

Figure 8A:
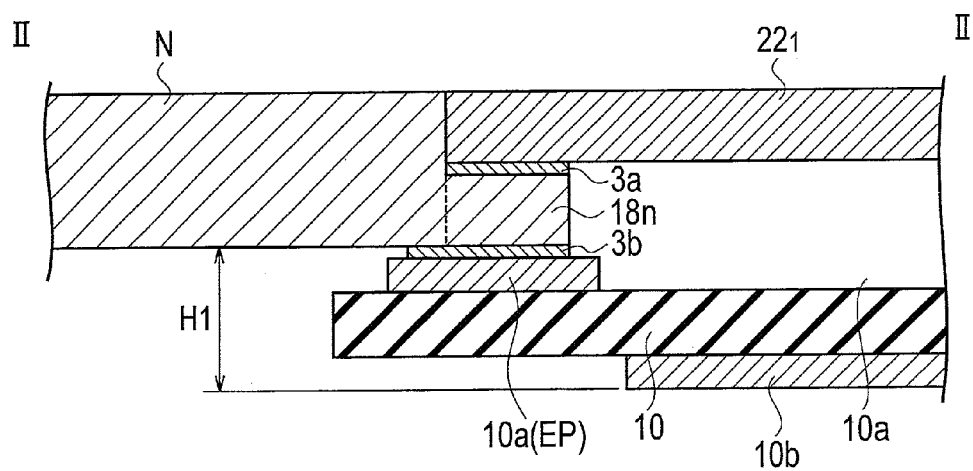
FIG. 8A is a schematic cross-sectional structure diagram taken in the line II-II of FIG. 5.
Figure 8B:
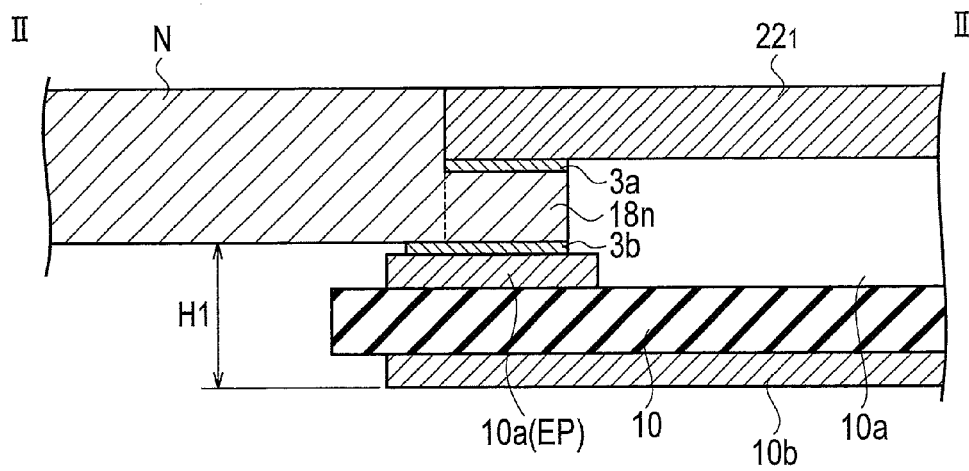
FIG. 8B is another schematic cross-sectional structure diagram taken in the line II-II of FIG. 5.

Moreover, FIG. 8A illustrates a schematic cross-sectional structure taken in the line II-II of FIG. 5, and FIG. 8B illustrates another schematic cross-sectional structure taken in the line II-II of FIG. 5.

Figure 9A:
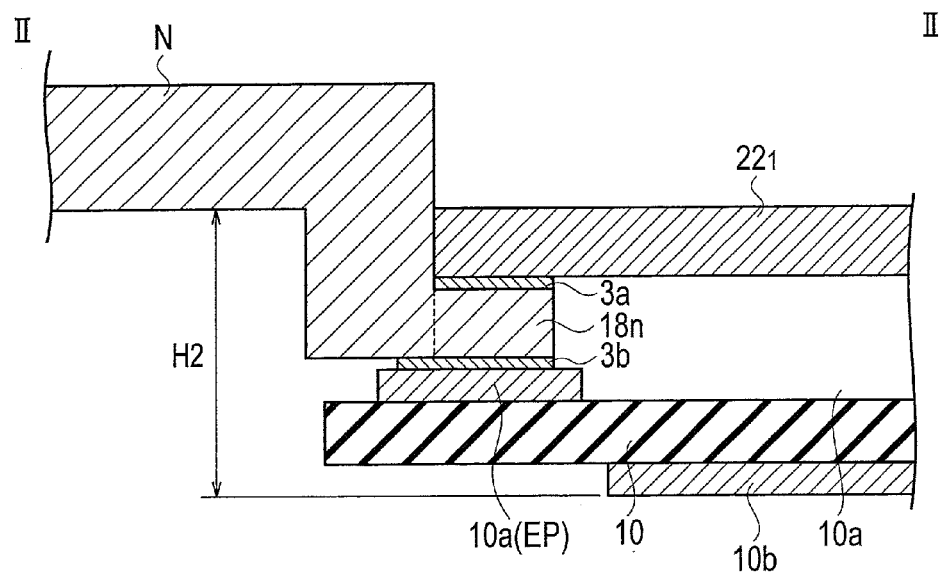
FIG. 9A is a schematic cross-sectional structure diagram taken in the line II-II of FIG. 5 (Modified Example 1).
Figure 9B:
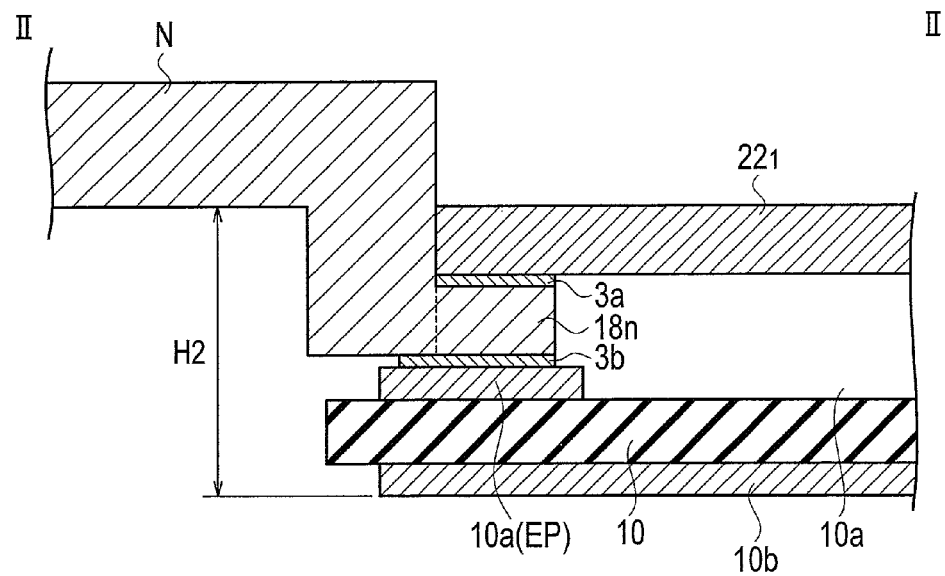
FIG. 9B is another schematic cross-sectional structure diagram taken in the line II-II of FIG. 5 (Modified Example 1).

Moreover, FIG. 9A illustrates a schematic cross-sectional structure according to a modified example 1 taken in the line II-II of FIG. 5, and FIG. 9B illustrates another schematic cross-sectional structure according to the modified example 1 taken in the line II-II of FIG. 5.

Figure 10A:
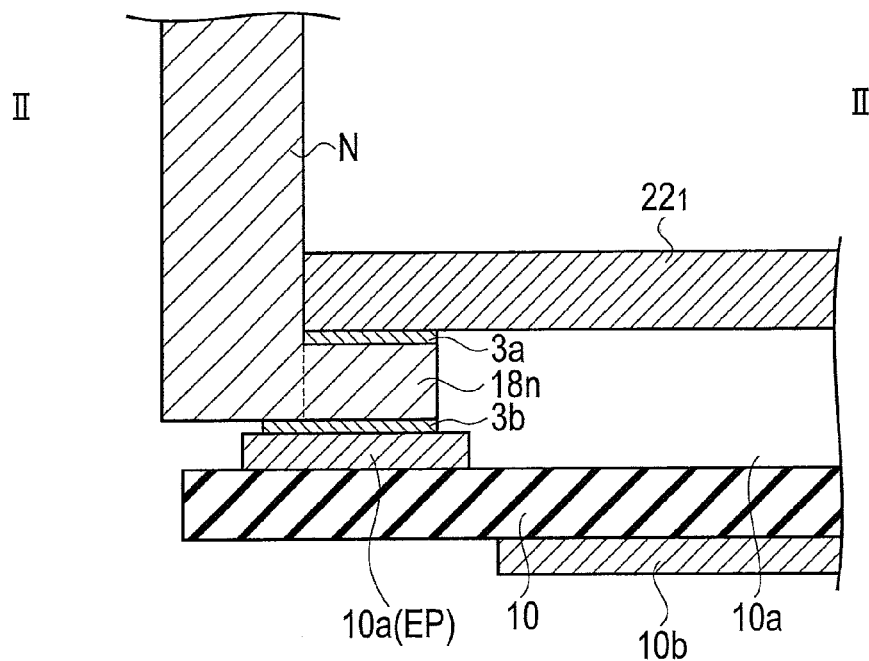
FIG. 10A is a schematic cross-sectional structure diagram taken in the line II-II of FIG. 5 (Modified Example 2).
Figure 10B:
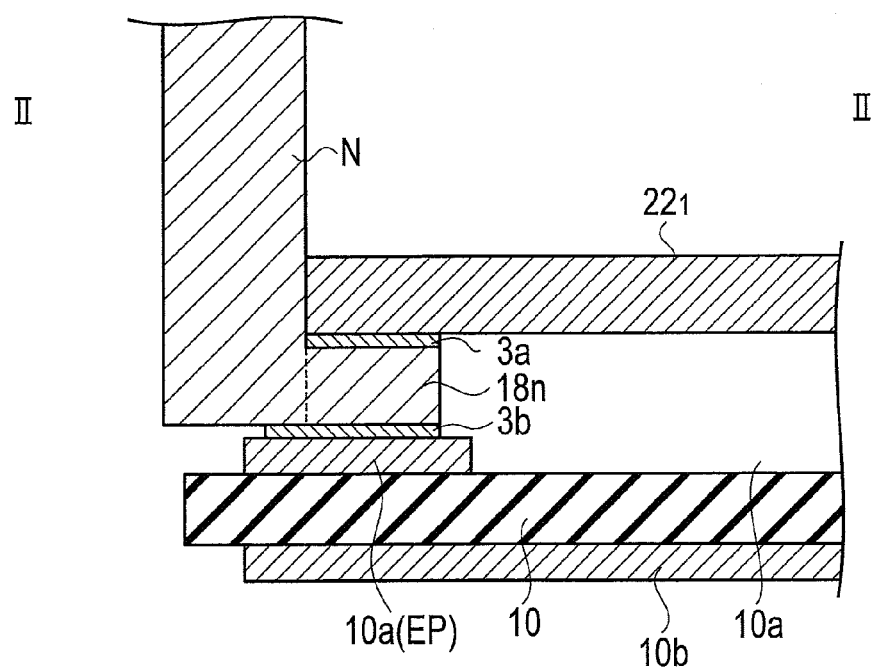
FIG. 10B is another schematic cross-sectional structure diagram taken in the line II-II of FIG. 5 (Modified Example 2).

Moreover, FIG. 10A illustrates a schematic cross-sectional structure according to a modified example 2 taken in the line II-II of FIG. 5, and FIG. 10B illustrates another schematic cross-sectional structure according to the modified example 2 taken in the line II-II of FIG. 5.

Figure 11A:
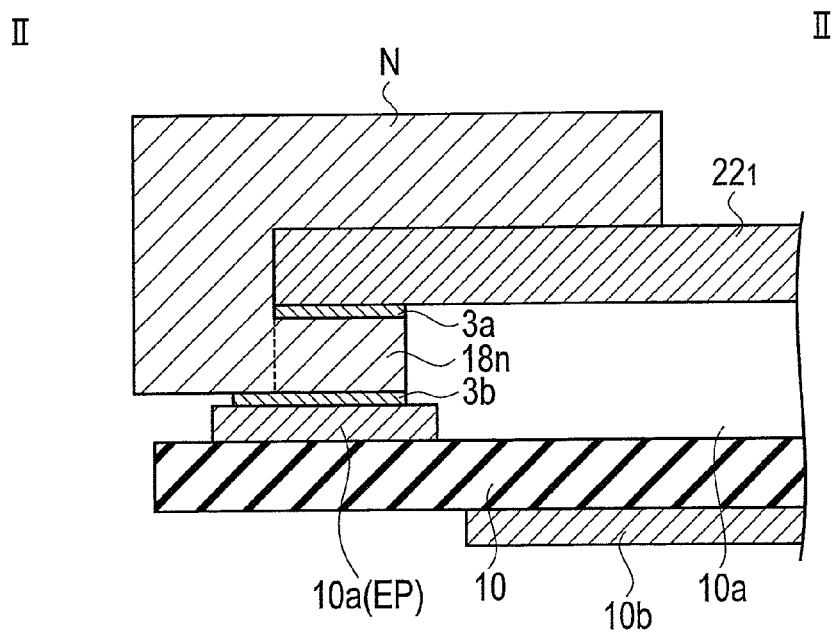
FIG. 11A is a schematic cross-sectional structure diagram taken in the line II-II of FIG. 5 (Modified Example 3).
Figure 11B:
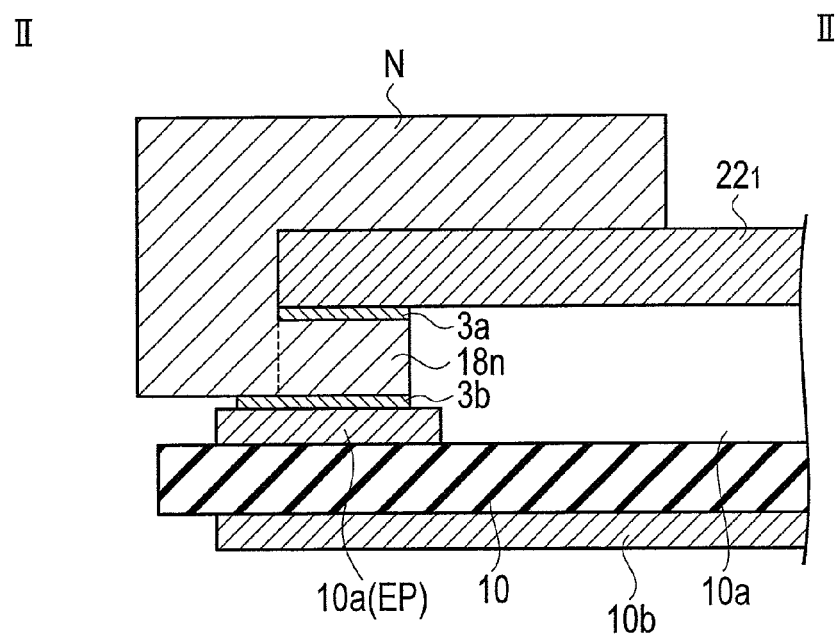
FIG. 11B is another schematic cross-sectional structure diagram taken in the line II-II of FIG. 5 (Modified Example 3).

Moreover, FIG. 11A illustrates a schematic cross-sectional structure according to a modified example 3 taken in the line II-II of FIG. 5, and FIG. 11B illustrates another schematic cross-sectional structure according to the modified example 3 taken in the line II-II of FIG. 5.

Note that, in FIGS. 8-11, the second pillar connection electrode $18_n$ is connected to the first upper surface plate electrode $22_1$ and the first copper plate layer 10a (second pattern EP) via the soldering layers 3a, 3b, for example.

Moreover, although an example that the copper plate layer 10b of the ceramic substrate 10 is not disposed below the second pillar connection electrode 18n is shown in FIGS. 8A, 9A, 10A and 11A, the copper plate layer 10b of the ceramic substrate 10 may be extended to be disposed below the second pillar connection electrode 18n as shown in FIGS. 8B, 9B, 10B and 11B. Such a configuration is advantageous, since heat can be conducted on the semiconductor chip and then escaped to the copper plate layer 10b of the ceramic substrate 10.

In the power module semiconductor device 1 according to the first embodiment, at least any one of the negative side power input terminal N, the output terminal O, and the positive side power input terminals P may have a bent structure. Here, the negative side power input terminal N has a bent structure in an example shown in FIGS. 9-11. Moreover, although the height of the negative side power input terminal N measured from the second copper plate layer 10b is H1 in an example shown in FIG. 8, the height of the negative side power input terminal N measured from the second copper plate layer 10b is H2>H1 in an example shown in FIG. 9 using the bent structure. Furthermore, the negative side power input terminal N has a structure bent along a vertical direction in an example shown in FIG. 10, and the negative side power input terminal N has a structure bent over the first upper surface plate electrode $22_1$ in an example shown in FIG. 11, thereby achieving space-saving of the negative side power input terminal N.

According to the power module semiconductor device 1 according to the first embodiment, each terminal can be floated by using the above-mentioned configuration and the terminal structure shown in FIGS. 8-11, thereby securing the creepage distance and the spatial distance from the heat sink.

The first pattern D(K4) of the first copper plate layer 10a is disposed on the surface of the ceramic substrate 10. The semiconductor chip Q4 is disposed on the first pattern D(K4). The second copper plate layer 10b is disposed on the back side surface of the ceramic substrate 10. The first pillar electrode $20_4$ is disposed on the semiconductor chip Q4. The resin layer 12 is disposed on the surface of the ceramic substrate 10 so as to cover the first copper plate layer 10a, the semiconductor chips Q1, Q4, the diodes D1, D4, the upper surface plate electrodes $22_1$, $22_4$, the pillar electrodes $20_1$, $20_4$, the pillar connection electrode $18_o$, $18_n$, and the pillar extended electrode 25, etc., and is disposed also on the back side surface of the ceramic substrate 10 so as to cover the second copper plate layer 10b.

In the power module semiconductor device 1 according to the first embodiment, the semiconductor chips Q1, Q4 are formed of an SiC MOSFET, for example, and the diode D1, D4 are formed of an SiC Schottky Barrier Diode (SBD), for example. Moreover, a thermistor is connected to between the thermistor connecting terminals B1, B2 on the ceramic substrate 10, and is used for thermal sensing of the power module semiconductor device 1 according to the first embodiment.

For example, the ceramic substrate 10 may be formed of $Al_2O_3$, AlN, SiN, AlSiC, or SiC of which at least the surface is insulation.

Note that the semiconductor chips Q1, Q4 do not always need to be adjacent to each other, and the semiconductor chips D1, D4 do not always need to be adjacent to each other, but their disposition may be suitably changed in consideration of thermal resistance.

Moreover, the resin layer 12 may be formed of a transfer-mold resin. The resin layer 12 may be formed of an epoxy based resin or a silicone based resin.

A plurality of chips of the semiconductor chips Q1, Q4 are disposed on the surface of the ceramic substrate 10 at a position apart from one another in planar view observed from a thickness direction of the ceramic substrate 10, and are resin-molded with the resin layer 12.

Moreover, the pillar connection electrodes $18_o$, $18_n$ may be formed of electrode materials of which the value of CTE is relatively smaller, e.g. CuMo, Cu, etc.

The upper surface plate electrodes $22_1$, $22_4$ portions may be formed of electrode materials of which the value of CTE is relatively smaller, e.g. CuMo, Cu, etc.

The source pillar electrodes $20_1$, $20_4$ portions may be formed of electrode materials of which the value of CTE is relatively smaller, e.g. CuMo, Cu, etc.

If materials of the same size of which the values of Coefficient of Thermal Expansion (CTE) are equivalent to each other are compared, the generated stress of materials having a larger value of Young's modulus becomes larger than that of materials having a smaller value of Young's modulus. Accordingly, if materials of which the value of Young's modulus×CTE is smaller is selected, structural members having a smaller value of the generated stress can be obtained.

CuMo has such an advantage. Although CuMo is inferior to Cu, the electric resistivity of CuMo is also relatively lower than that of Cu.

Herein, a separation distance along the surface between the upper surface plate electrodes $22_1$, $22_4$ is called a creepage distance. A value of the creepage distance thereof is approximately 6 mm, for example.

As a first means for the purpose of compact and a weight saving of the power module semiconductor device 1, the chip can be miniaturized by adapting SiC MOSFET. The normalized on resistance of SiC MOSFET is approximately one-tenth that of Si MOSFET. Accordingly, if devices having the same on resistance are compared, the chip area of the SiC MOSFET is approximately one-tenth that of Si MOSFET.

As a second means for the purpose of compact and weight saving of the power module semiconductor device 1, reduction of the thickness of ceramic substrates can be attempted. Since the bending strength of AlN as a ceramic substrate currently generally used is smaller, it will be broken if the thickness of the substrate is reduced. Moreover, if the thickness of a copper foil to be bonded for improving the thermal resistance or the electric resistance is increased, such a copper foil will removed during a heat cycle test. Therefore, it is difficult to secure the reliability. Accordingly, it is preferable to use SiN as a ceramic substrate. As a merit of SiN, there is a feature that SiN is hard to break even when being thinly formed, since the bending strength of SiN is larger. On the other hand, as a demerit of SiN, the coefficient of thermal conductivity of SiN is lower than that of AlN, and the CTE of SiN is larger than that of AlN. As a specific example of the values, the bending strength of AlN is approximately 400 GPa, but the bending strength of SiN is approximately 850 GPa. On the other hand, the coefficient of thermal conductivity of SiN is approximately 35 W/mK, but the coefficient of thermal conductivity of AlN is approximately 170 W/mK. Moreover, the CTE of SiN is approximately 850 ppm/degree C., but the CTE of AlN is approximately 5.7 ppm/degree C.

(Configuration Example of Semiconductor Chip)

Figure 13:
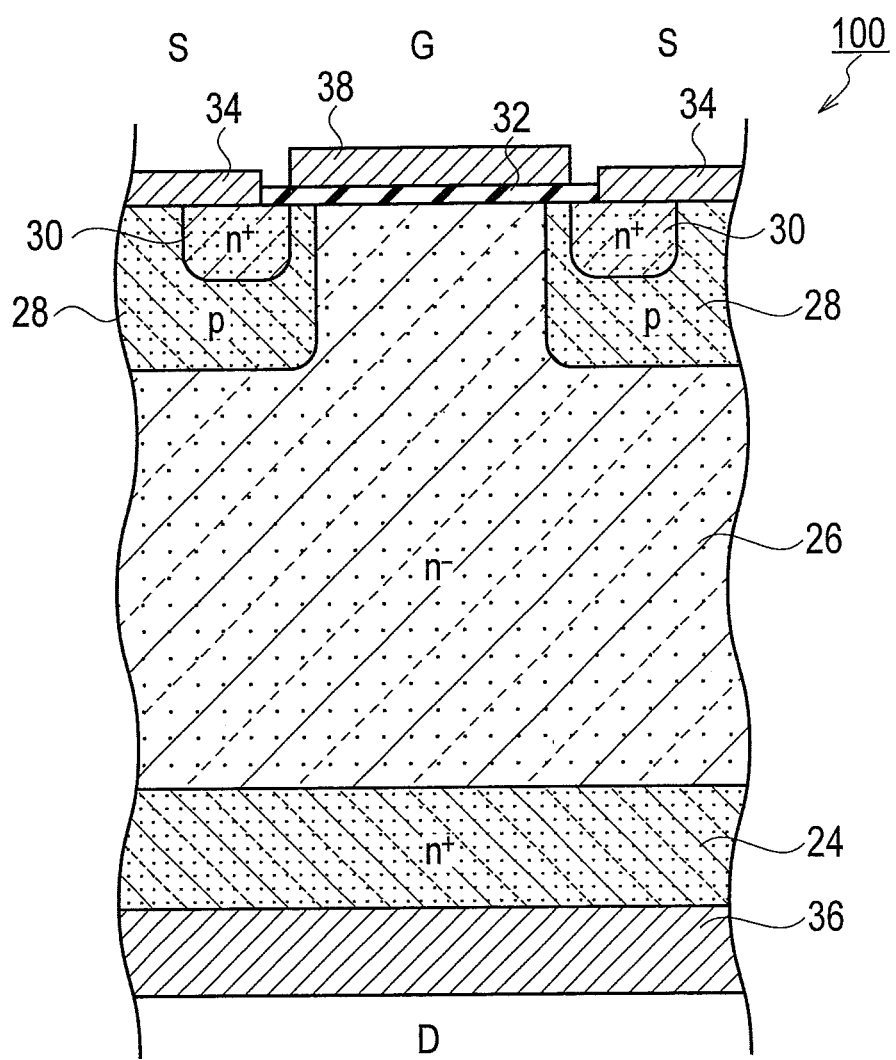
FIG. 13 is a schematic cross-sectional structure diagram showing an SiC MOSFET, which is an example of a semiconductor chip applied to the power module semiconductor device according to the first embodiment.

As shown in FIG. 13, the schematic cross-sectional structure of the SiC MOSFET as an example of the semiconductor chip 100 (Q1, Q4) applied to the power module semiconductor device 1 according to the first embodiment includes: a semiconductor substrate 26 composed of an n-type high resistivity layer; a p type base region 28 formed on the surface side of the semiconductor substrate 26; source regions 30 formed on the surface of the p type base regions 28; a gate insulating film 32 disposed on the surface of the semiconductor substrate 26 between the p type base regions 28; a gate electrode 38 disposed on the gate insulating film 32; a source electrode 34 connected to the source region 30 and the p type base region 28; an n+ drain region 24 disposed on a back side surface opposite to the surface of the semiconductor substrate 26; and a drain pad electrode 36 connected to the n+ drain region 24.

In FIG. 13, although the semiconductor chip 100 is composed of a planar-gate-type n channel vertical SiC-MOSFET, the semiconductor chip 100 may be composed of a trench-gate-type n channel vertical SiC-MOSFET, etc.

Moreover, a GaN based FET etc. instead of SiC MOSFET are also applicable to the semiconductor chip 100 (Q1, Q4) applied to the power module semiconductor device 1 according to the first embodiment.

Any one of an SiC based power device, a GaN based power device, and an AlN based power device is applicable to the semiconductor chip 100 applied to the power module semiconductor device 1 according to the first embodiment.

Furthermore, a semiconductor of which the bandgap energy is from 1.1 eV to 8 eV, for example, can be used for the semiconductor chip 100 applied to the power module semiconductor device 1 according to the first embodiment.

Figure 14:
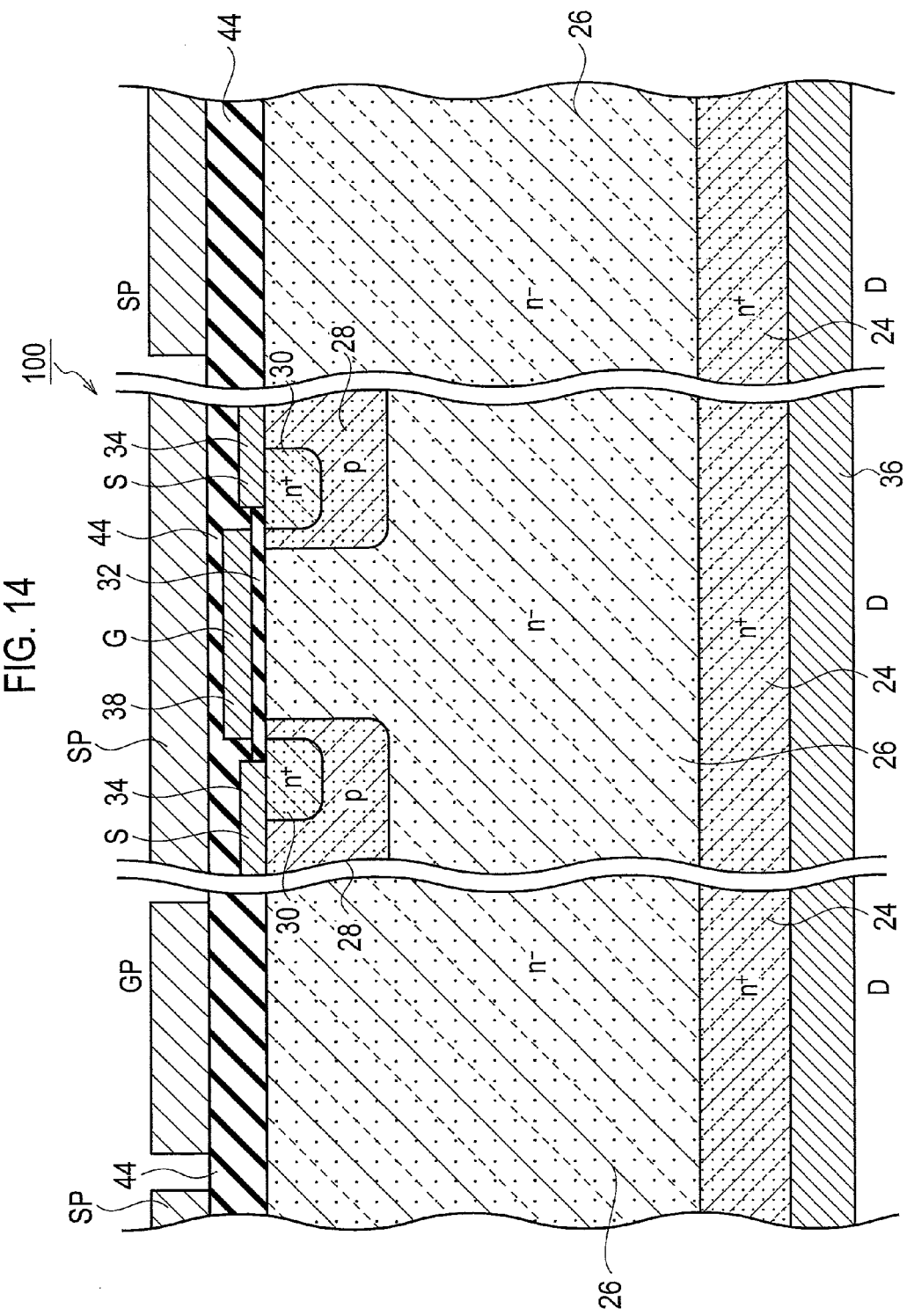
FIG. 14 is a schematic cross-sectional structure diagram showing an SiC MOSFET including a source pad electrode SP and a gate pad electrode GP, which is an example of the semiconductor chip applied to the power module semiconductor device according to the first embodiment.

FIG. 14 illustrates a schematic cross-sectional structure of an SiC MOSFET including a source pad electrode SP and a gate pad electrode GP, which is an example of the semiconductor chip 100 applied to the power module semiconductor device 1 according to the first embodiment. The gate pad electrode GP is connected to the gate electrode 38 disposed on the gate insulating film 32, and the source pad electrode SP is connected to the source electrode 34 connected to the source region 30 and the p type base region 28.

Moreover, as shown in FIG. 14, the gate pad electrode GP and the source pad electrode SP are disposed on an interlayer insulating film 44 for passivation which covers the surface of the semiconductor chip 100. Note that, although an illustration is omitted in the constructional example shown in FIG. 12, microstructural transistor structure may be formed in the semiconductor substrate 26 below the gate pad electrode GP and the source pad electrode in the same manner as the center portion shown in FIG. 13 or 14.

Furthermore, as shown in FIG. 14, the source pad electrode SP may be disposed to be extended onto the interlayer insulating film 44 for passivation, also in the transistor structure of the center portion.

(Example Applications for Applying Semiconductor Device)

Next, there will now be explained a three-phase alternating current (AC) inverter composed using the power module semiconductor device 1 according to the first embodiment, with reference to FIG. 15.

Figure 15:
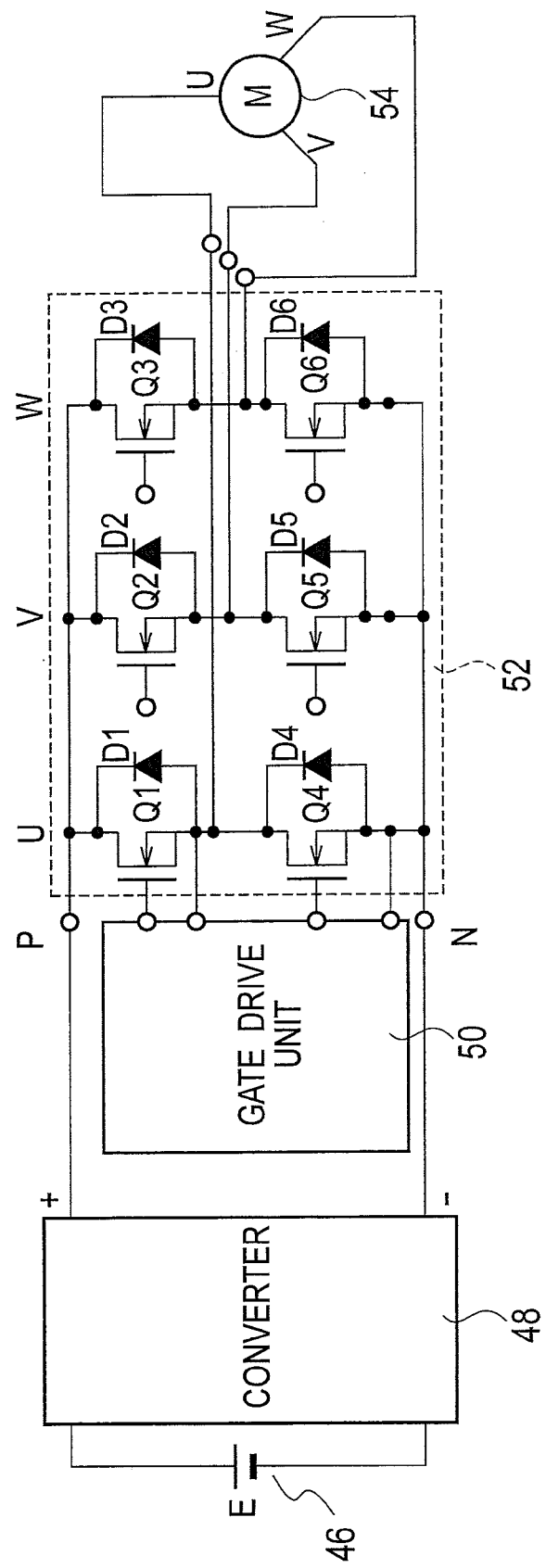
FIG. 15 is a schematic circuit configuration diagram of a three-phase alternating current (AC) inverter composed using the power module semiconductor device according to the first embodiment.

As shown in FIG. 15, the three-phase AC inverter includes: a gate drive unit 50; a power module unit 52 connected to the gate drive unit 50 and a three-phase alternating current (AC) motor unit 54. Inverters of U phase, V phase and W phase are connected to the power module unit 52 corresponding to U phase, V phase, and W phase of the three-phase AC motor unit 54. In this case, although the gate drive unit 50 is connected to the SiC MOSFETs Q1, Q4 as shown in FIG. 15, the gate drive unit 50 is similarly connected also to the SiC MOSFETs Q2, Q5 and Q3, Q6 (not shown in drawings).

In the power module unit 52, the SiC MOSFETs Q1, Q4, and Q2, Q5, and Q3, Q6 having inverter configurations are connected between a positive terminal (+) and a negative terminal (−) to which the converter 48 in a storage battery (E) 46 is connected. Furthermore, diodes D1-D6 are connected inversely in parallel to one another between the source and the drain of the SiC-MOSFETs Q1 to Q6.

Although the structure of the single phase inverter corresponding to U phase portion shown in FIG. 15 has been explained in the power module semiconductor device 1 according to the first embodiment, the three-phase power module unit 52 can also be similarly formed corresponding to V phase and W phase.

In the power module semiconductor device 1 according to the first embodiment, the first group of signal terminals (G4, S4, T4) and the second group of signal terminals (G1, S1, T1) may have a configuration bent along the thickness direction of the ceramic substrate 10.

Moreover, in the power module semiconductor device 1 according to the first embodiment, a plurality of the power module semiconductor devices may be disposed in parallel to one another.

Figure 16:
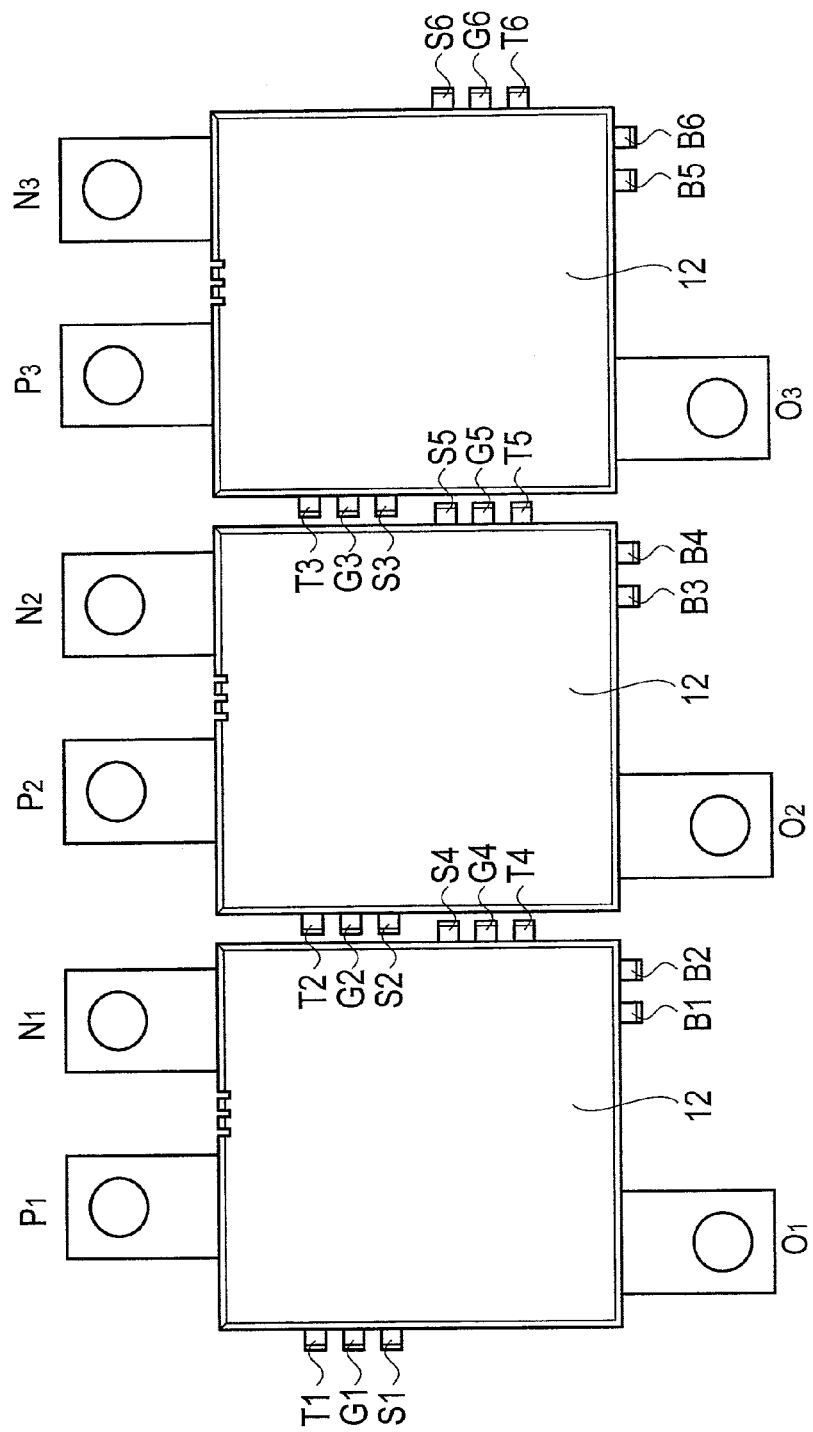
FIG. 16 is a schematic plane configuration diagram showing three pieces of the power module semiconductor devices according to the first embodiment disposed in parallel to one another in order to drive the three-phase AC inverter.
Figure 17:
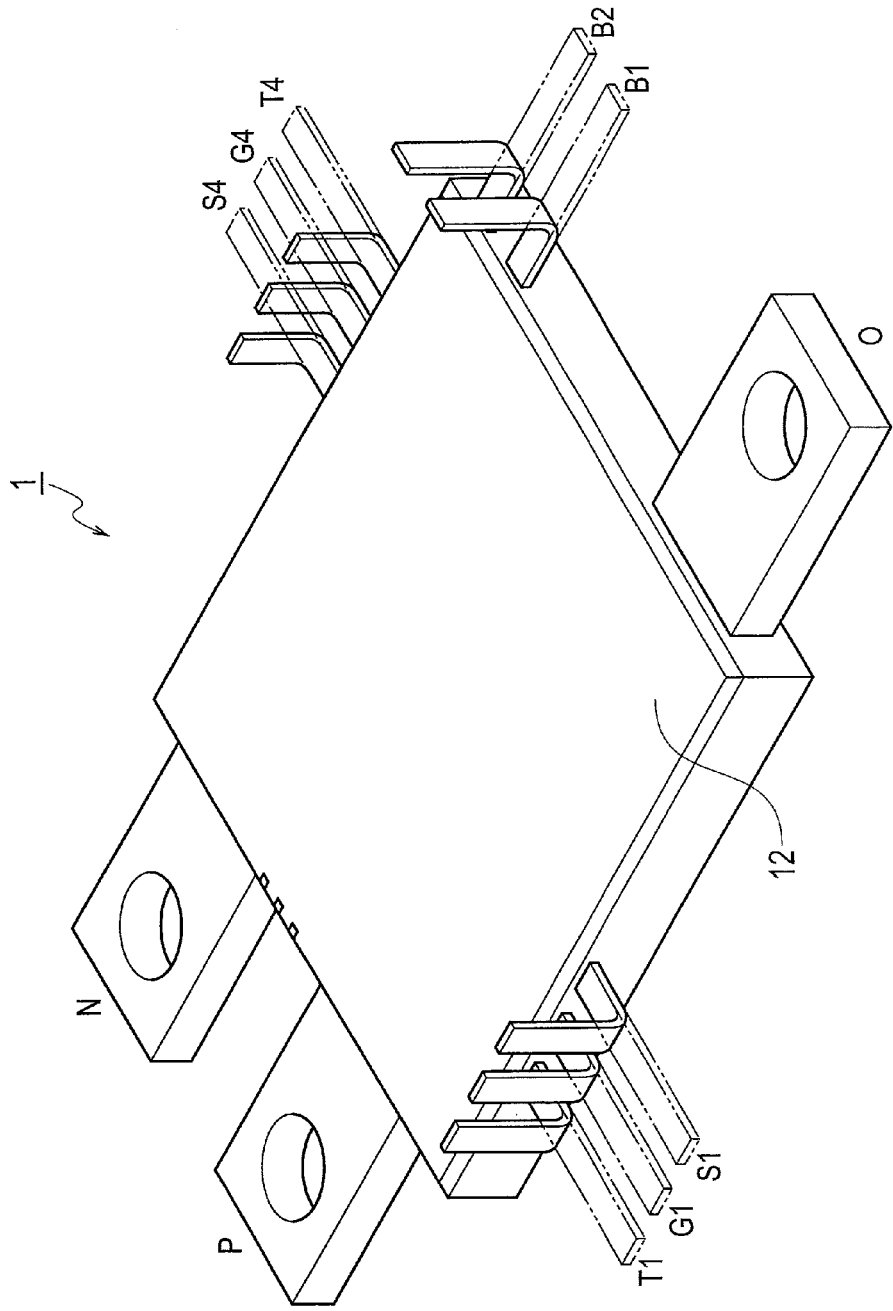
FIG. 17 is a schematic bird's-eye view configuration diagram showing the power module semiconductor device according to the first embodiment in which signal terminals are bent.
Figure 18:
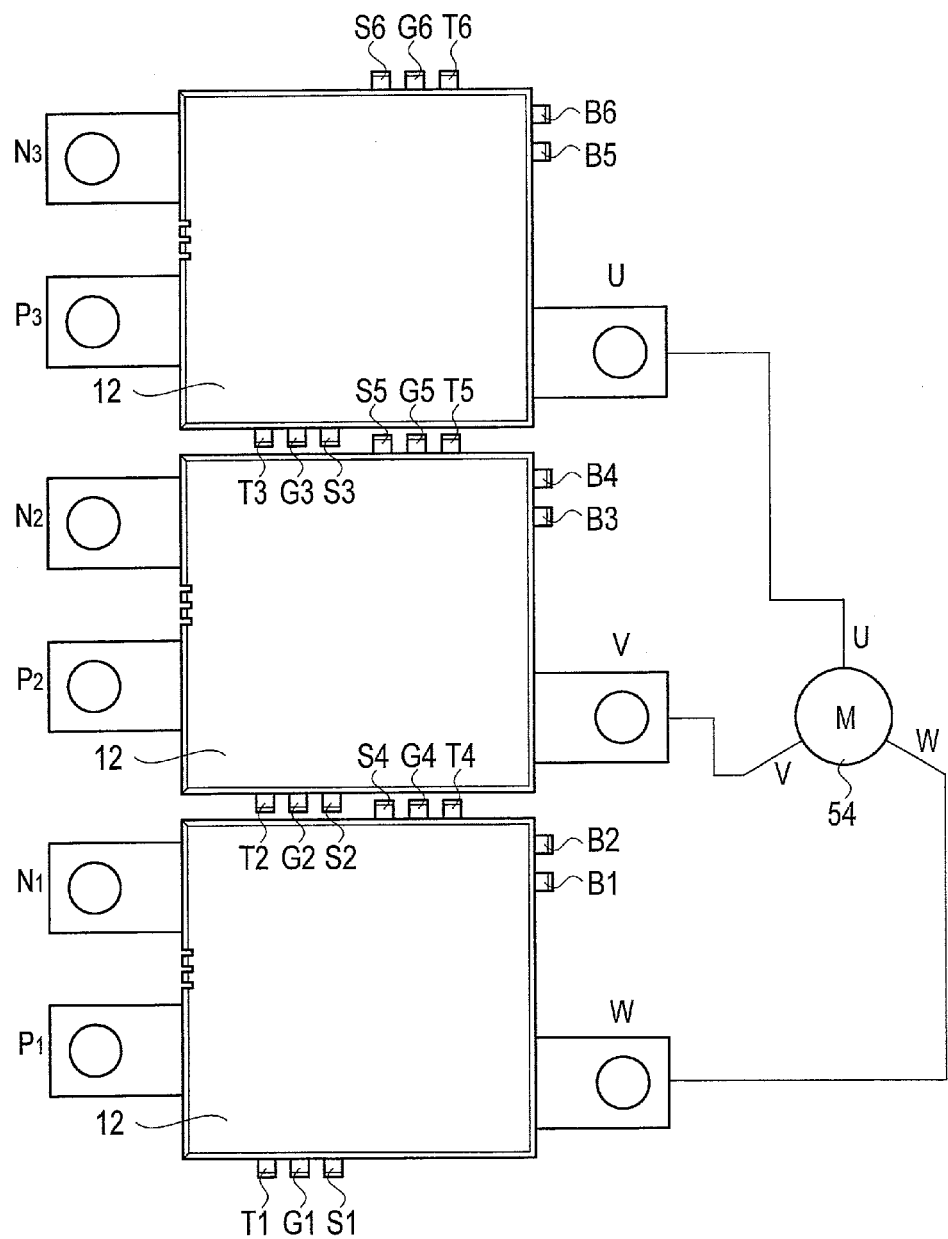
FIG. 18 is a schematic plane configuration diagram showing three pieces of the power module semiconductor devices according to the first embodiment disposed in parallel to one another, driving the three-phase AC inverter.

FIG. 16 illustrates a schematic plane configuration of three pieces of the power module semiconductor devices according to the first embodiment disposed in parallel to one another in order to drive the three-phase AC inverter. Moreover, FIG. 17 illustrates a schematic bird's-eye view configuration of the power module semiconductor device 1 according to the first embodiment in which signal terminals are bent. FIG. 18 illustrates a schematic plane configuration of three pieces of the power module semiconductor devices according to the first embodiment disposed in parallel to one another for driving the three-phase AC inverter.

According to the power module semiconductor device 1 according to the first embodiment, in the structure in which any one of the group of signal terminals (G1, S1, T1) and the group of signal terminals (G4, S4, T4), or the positive side power input terminal P, the negative side power input terminal N, and the output terminal O projected from all four sides (all side surfaces) of the package module, the group of signal terminals (G1, S1, T1) and the group of signal terminals (G4, S4, T4) at the respective opposite sides are alternately disposed, thereby reducing an occupied area in the case of disposing the power module semiconductor devices 1 in parallel to one another as shown in FIG. 16. Furthermore, as shown in FIG. 17, as shown in FIGS. 16 and 18, the occupied area in the case of disposing the power module semiconductor devices 1 in parallel to one another can be reduced by bending the signal terminals (G1, S1, T1) and (G4, S4, T4). Accordingly, reduction in size and weight of the whole device and can be achieved.

According to the first embodiment, there can be provided the power module semiconductor device allowing reduction in size and weight of the 2-in-1 thin type SiC power module.

Second Embodiment

FIG. 12 illustrates a schematic circuit representative of a 2-in-1 module, which is a power module semiconductor device 2 according to the second embodiment. Moreover, FIG. 20 illustrates a detail circuit representative of the 1-in-1 module, which is the power module semiconductor device 2 according to the second embodiment.

The power module semiconductor device 2 according to the second embodiment has a configuration of 1-in-1 module. More specifically, one MOSFET Q is included in one module. As an example, six chips (MOS transistor×6) can be mounted thereon, and a maximum of six pieces of the MOSFETs respectively can be connected to one another in parallel. Note that it is also possible to mount a part of six pieces of the chips for the diode DI.

Figure 19:
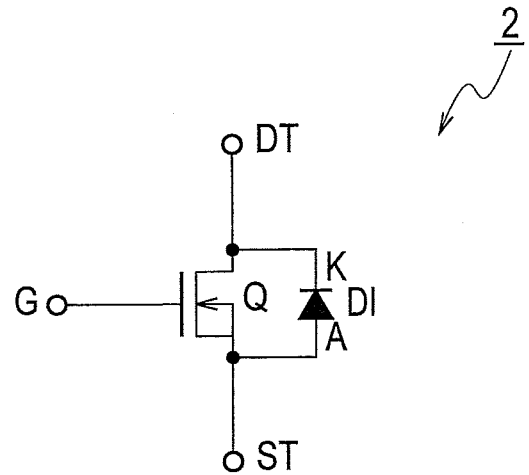
FIG. 19 is a schematic circuit representative diagram showing a 1-in-1 module, which is a power module semiconductor device according to a second embodiment.

The diode DI connected to the MOSFET Q inversely in parallel is shown in FIG. 19. A main electrode of the MOSFET Q is expressed with a drain terminal DT and a source terminal ST.

Figure 20:
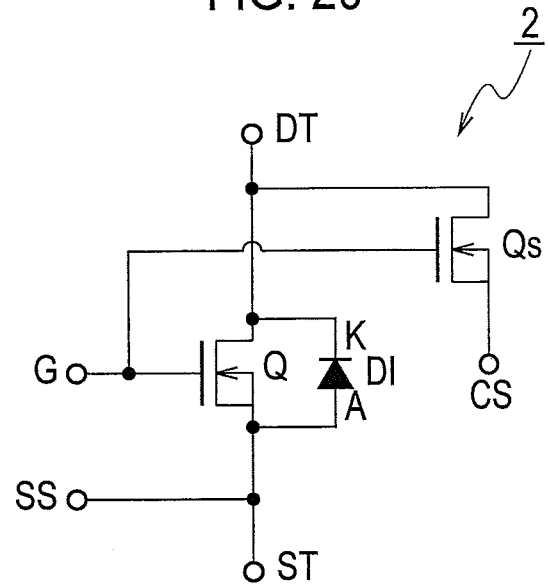
FIG. 20 is a detail circuit representative diagram showing the 1-in-1 module, which is the power module semiconductor device according to the second embodiment.

More particularly, as shown in FIG. 20, a sense MOSFET Qs is connected to the MOSFET Q in parallel. The sense MOSFET Qs is formed as a minuteness transistor in the same chip as the MOSFET Q. Note that, also in the semiconductor chips Q1, Q4 according to the first embodiment, the sense MOSFET Qs is formed as a minuteness transistor in the same chip.

Figure 21:
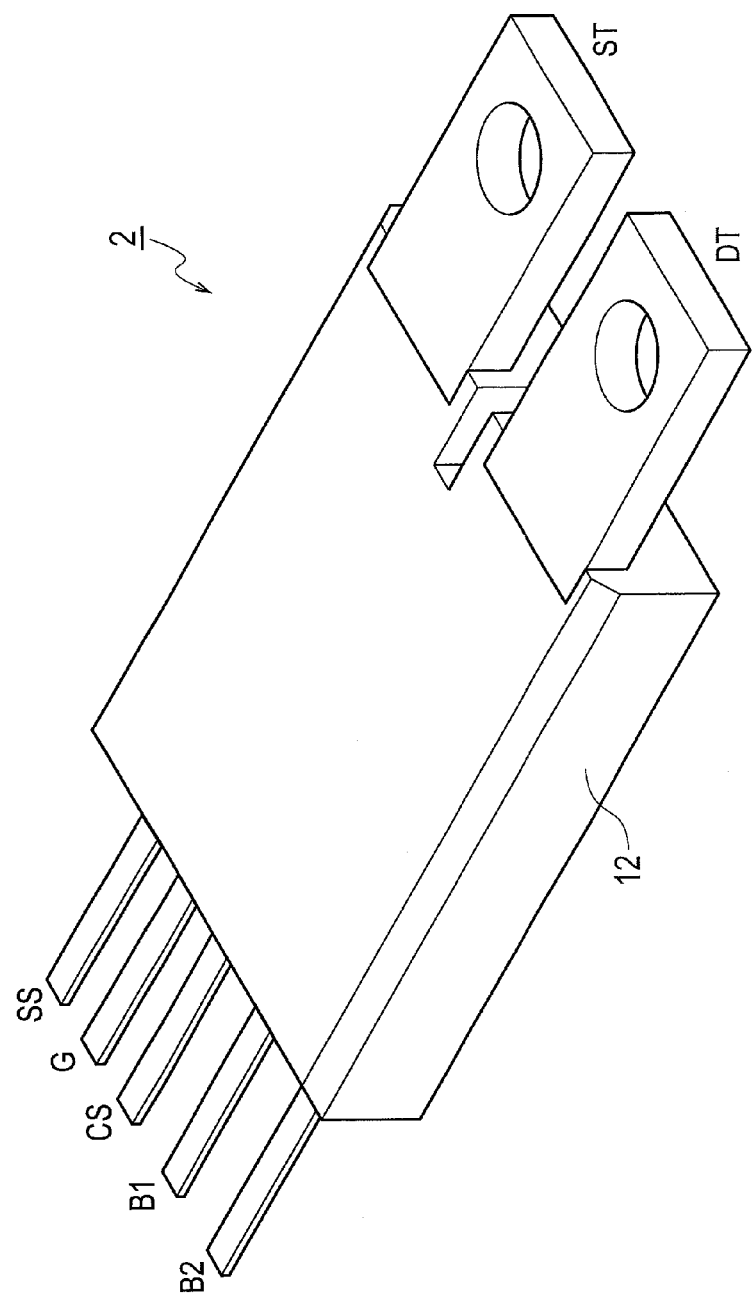
FIG. 21 is a schematic bird's-eye view configuration diagram showing the 1-in-1 module, which is the power module semiconductor device according to the second embodiment.

As shown in FIG. 21, the power module semiconductor device 2 according to the second embodiment includes: a drain terminal DT and a source terminal ST which are disposed on a first side of the ceramic substrate 10 covered with the resin layer 12; and a group of signal terminals SS, G, CS, B1, B2 disposed on a side opposite to the first side. In this case, the group of signal terminals SS, G, CS correspond to the source sense terminal, the gate signal terminal, and the current sense terminal of the semiconductor chip Q, and the group of signal terminals B1, B2 correspond to the thermistor connecting terminal. In this case, the source terminal ST corresponds to the first power input terminal, and the drain terminal DT correspond to the second power input terminal.

Figure 22:
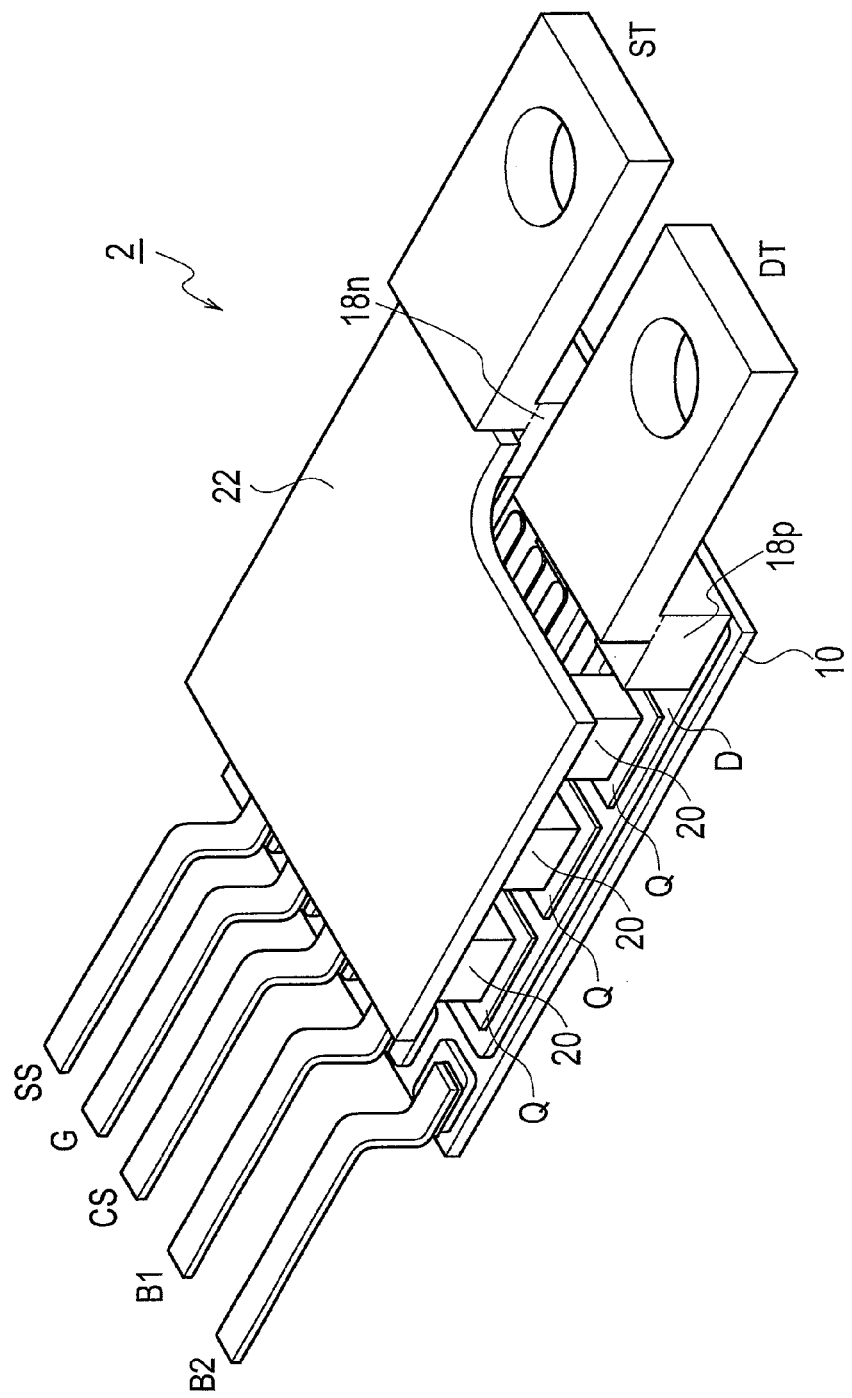
FIG. 22 is a schematic bird's-eye view configuration diagram showing the 1-in-1 module, which is the power module semiconductor device according to the second embodiment, before forming a resin layer thereon.

Moreover, FIG. 22 illustrates a schematic bird's-eye view configuration of the power module semiconductor device 2 before forming a resin layer 12 thereon.

Figure 23:
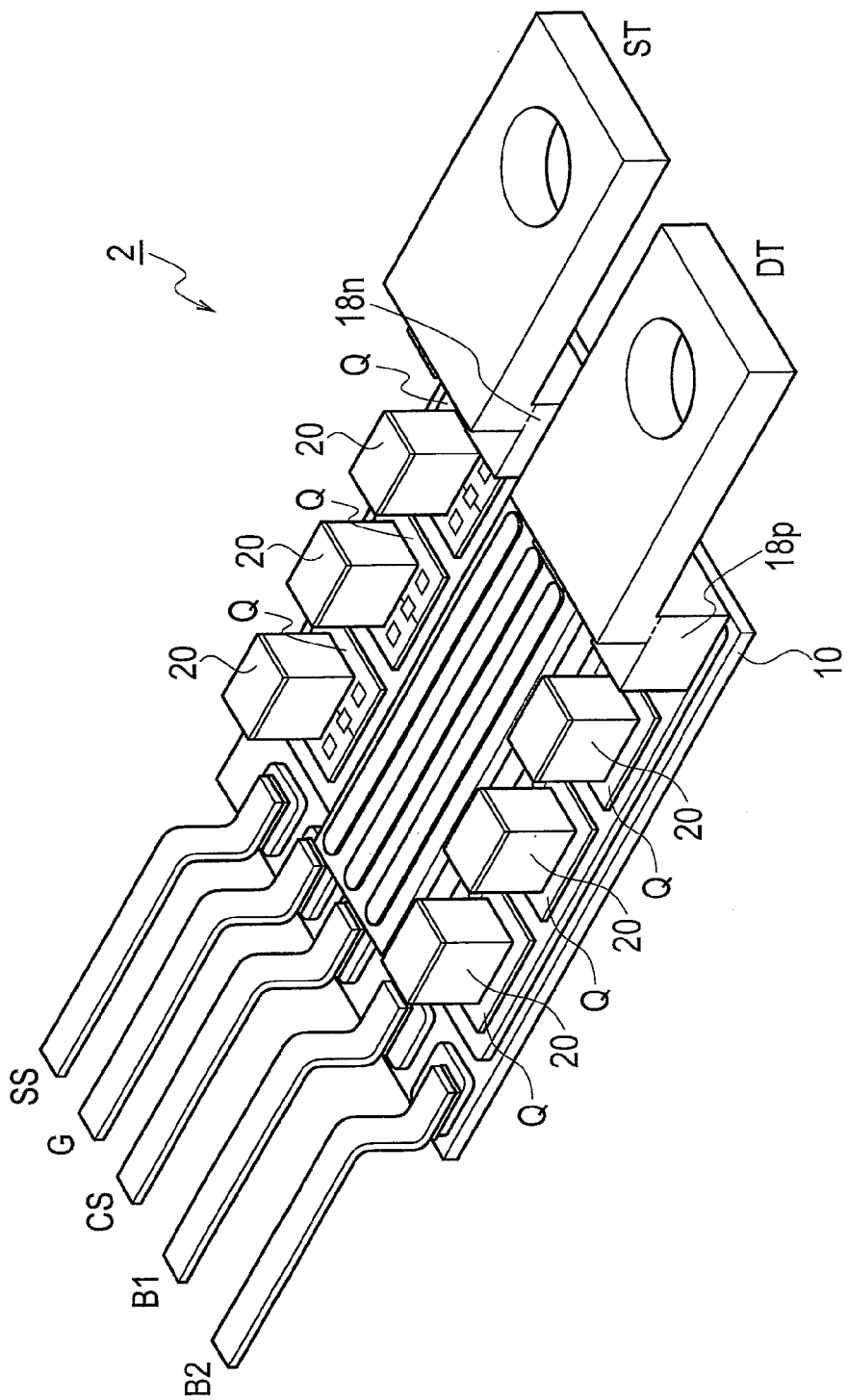
FIG. 23 is a schematic bird's-eye view configuration diagram showing the 1-in-1 module, which is the power module semiconductor device according to the second embodiment, before forming an upper surface plate electrode thereon.

Furthermore, FIG. 23 illustrates a schematic bird's-eye view configuration of the power module semiconductor device 2, before forming an upper surface plate electrode 22 thereon.

Figure 24:
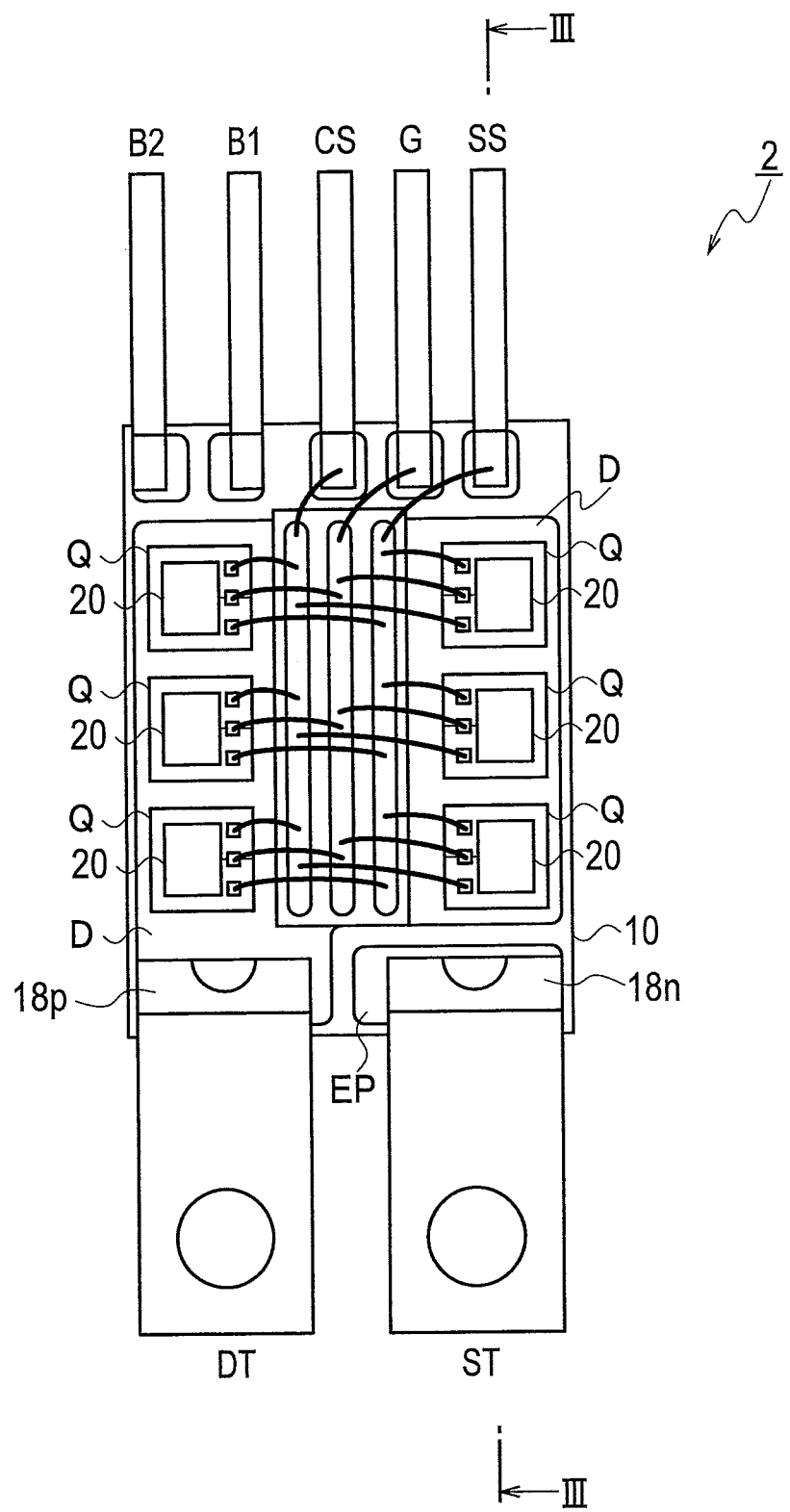
FIG. 24 is a schematic planar pattern configuration diagram showing the 1-in-1 module, which is a power module semiconductor device according to the second embodiment.
Figure 26:
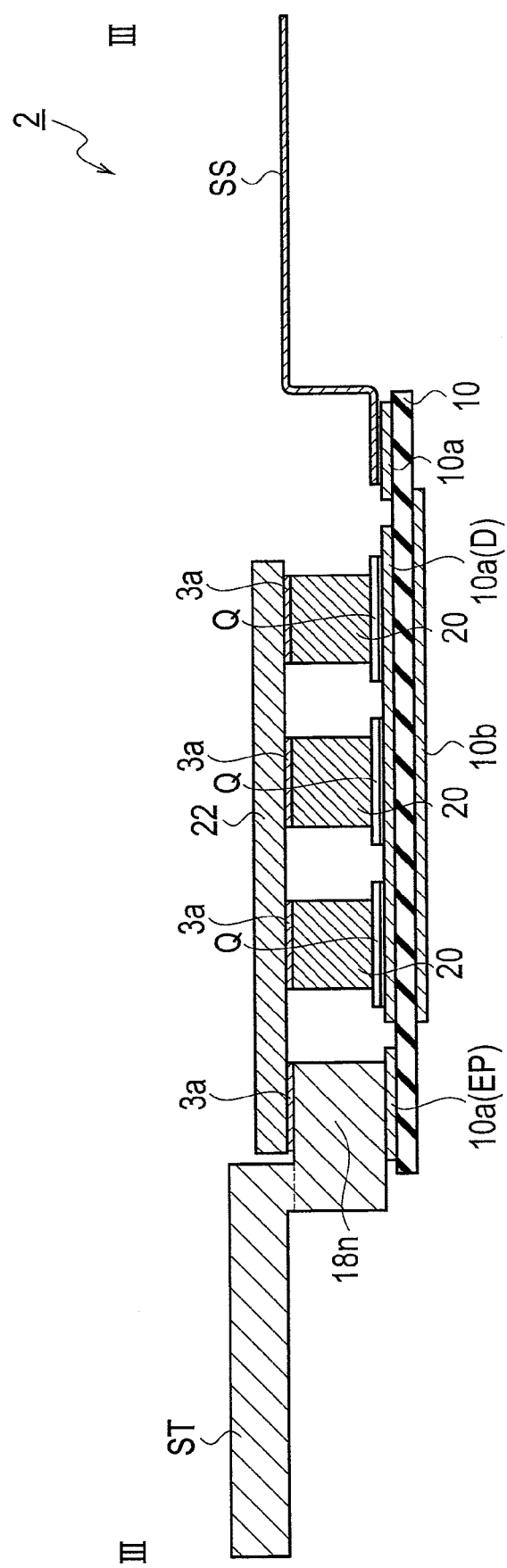
FIG. 26 is a schematic cross-sectional structure diagram taken in the line III-III of FIG. 24.

Moreover, FIG. 24 illustrates a schematic planar pattern configuration of the 1-in-1 module, which is the power module semiconductor device 2 according to the second embodiment. FIG. 26 illustrates a schematic cross-sectional structure taken in the line of FIG. 24.

Figure 25:
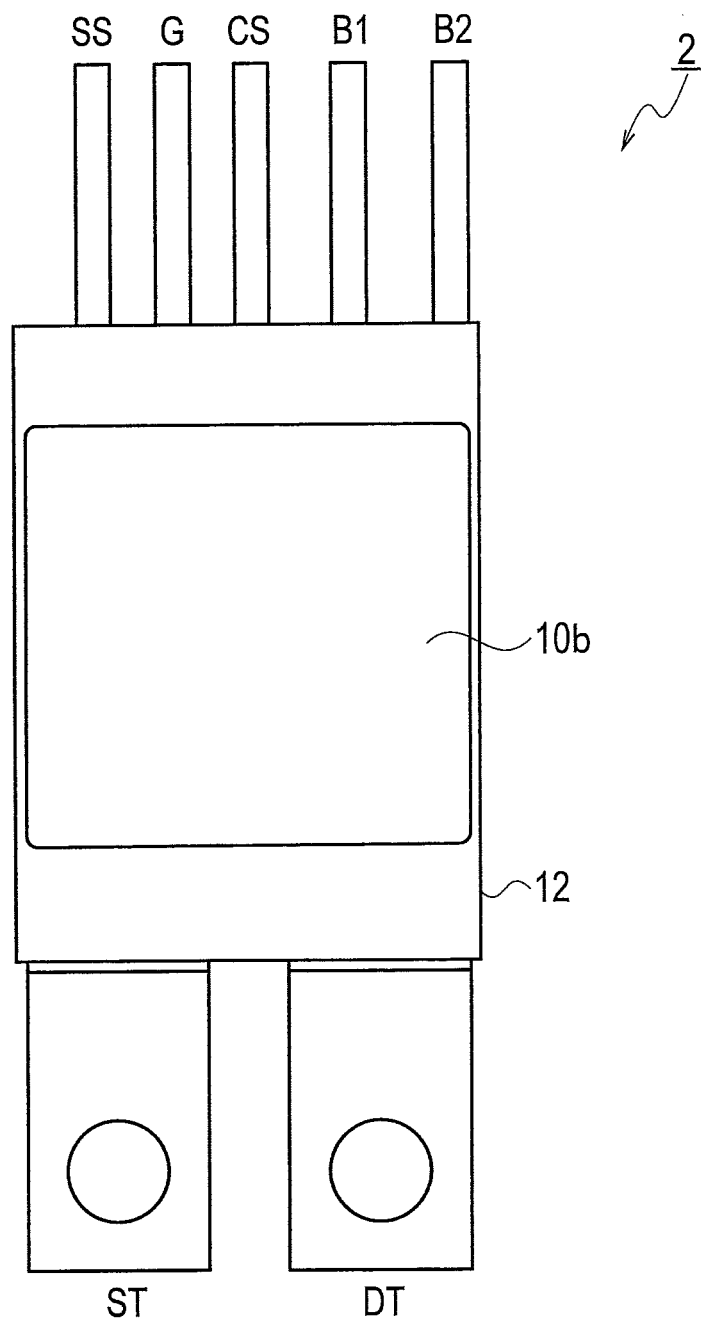
FIG. 25 is a schematic back side external configuration diagram showing the 1-in-1 module, which is a power module semiconductor device according to the second embodiment.

Moreover, FIG. 25 illustrates a schematic back side external appearance configuration of the 1-in-1 module, which is the power module semiconductor device 2 according to the second embodiment. The second copper plate layer 10b disposed on the back side surface of the ceramic substrate 10 also functions as a heat spreader.

As shown in FIGS. 21-26, the power module semiconductor device 2 according to the second embodiment includes the negative side power input terminal N which is also equipped with a function of the pillar connection electrode $18_n$ which electrically connects the upper surface plate electrode 22 to the electrode pattern EP on the ceramic substrate 10, in SiC TPM. Moreover, the power module semiconductor device 2 includes the drain terminal DT which is also equipped with a function of the pillar connection electrode $18_p$ which electrically connects the drain terminal DT to the electrode pattern D on the ceramic substrate 10. The source terminal ST and the drain terminal DT function as a power terminal.

The power module semiconductor device 2 according to the second embodiment includes the source terminal ST which is also equipped with a function of the pillar connection electrode $18n$ which electrically connects the upper surface plate electrode 22 to the electrode pattern EP on the ceramic substrate 10, and the drain terminal DT which is also equipped with a function of the pillar connection electrode $18p$ which electrically connects the drain terminal DT to the electrode pattern D on the ceramic substrate 10. Accordingly, since the number of structural members can be reduced, the power module size can be reduced, thereby improving a power density of the power module. Consequently, reduction of a manufacturing cost can be achieved.

According to the power module semiconductor device 2 according to the second embodiment, the number of structural members can be reduced, thereby increasing the number of the chips.

Techniques, e.g. solder bonding, metallic bonding using metallic particles, solid phase diffusion bonding, and transient liquid phase (TLP) bonding, are applicable to form a bonded structure of each structural member.

As shown in FIGS. 21-26, the power module semiconductor device 2 according to the second embodiment includes: a ceramic substrate 10; a first pattern DK4 of a first copper plate layer 10a disposed on the surface of the ceramic substrate 10; a semiconductor chip Q disposed on the first pattern D; a first pillar connection electrode $18_p$ disposed on the first pattern D; and a drain terminal DT connected to the first pillar connection electrode $18_p$.

Moreover, the power module semiconductor device 2 may include: a second pattern EP of the first copper plate layer 10a; a second pillar connection electrode $18_n$ disposed on the second pattern EP; and a source terminal ST connected to the second pillar connection electrode $18_n$.

Moreover, the power module semiconductor device 2 may include a pillar electrode 20 disposed on the semiconductor chip Q.

Moreover, although the illustration is omitted herein, the power module semiconductor device 2 may include a first diode DI disposed so as to be adjacent to the semiconductor chip Q on the first pattern D. Furthermore, in some cases, the diode DI may be disposed on the first pattern D in all the chips.

Moreover, the power module semiconductor device 2 may include an upper surface plate electrode 22 disposed on the pillar electrode 20.

Moreover, although the illustration is omitted herein, the power module semiconductor device 2 may include an upper surface plate electrode 22 disposed on the pillar electrode 20 and connected to the anode electrode A of the diode DI.

As shown in FIG. 22, the upper surface plate electrode 22 is preferable to have a curved concave L-shaped structure in an inside corner portion, in planar view. It is for the purpose of reducing the electric resistance.

Also in the power module semiconductor device 2 according to the second embodiment, the semiconductor chip Q is formed of an SiC MOSFET, for example, and the diode DI is formed of an SiC Schottky barrier diode (SBD), for example.

Moreover, a thermistor is connected to between the thermistor connecting terminals B1, B2 on the ceramic substrate 10, and is used for thermal sensing of the power module semiconductor device 2 according to the second embodiment.

Since other configurations are the same as those of the power module semiconductor device 1 according to the first embodiment, the duplicated description is omitted.

FIG. 13 similarly illustrates a schematic cross-sectional structure of the SiC MOSFET, as an example of the semiconductor chip 100 (Q) applied to the power module semiconductor device 2 according to the second embodiment. In FIG. 13, although the semiconductor chip 100 is composed of a planar-gate-type n channel vertical SiC-MOSFET, the semiconductor chip 100 may be composed of a trench-gate-type n channel vertical SiC-MOSFET, etc.

Moreover, a GaN based FET etc. instead of the SiC MOSFET are also applicable to the semiconductor chip 100 (Q) applied to the power module semiconductor device 2 according to the second embodiment.

Any one of an SiC based power device, a GaN based power device, and an AlN based power device is applicable to the semiconductor chip 100 applied to the power module semiconductor device 2 according to the second embodiment.

A schematic cross-sectional structure of the SiC MOSFET including the source pad electrode SP and the gate pad electrode GP, which is an example of the semiconductor chip 100 applied to the power module semiconductor device 2 according to the second embodiment, is similarly illustrated as shown in FIG. 14.

According to the second embodiment, there can be provided the power module semiconductor device allowing reduction in size and weight of the 1-in-1 thin type SiC power module.

Third Embodiment

Figure 27A:
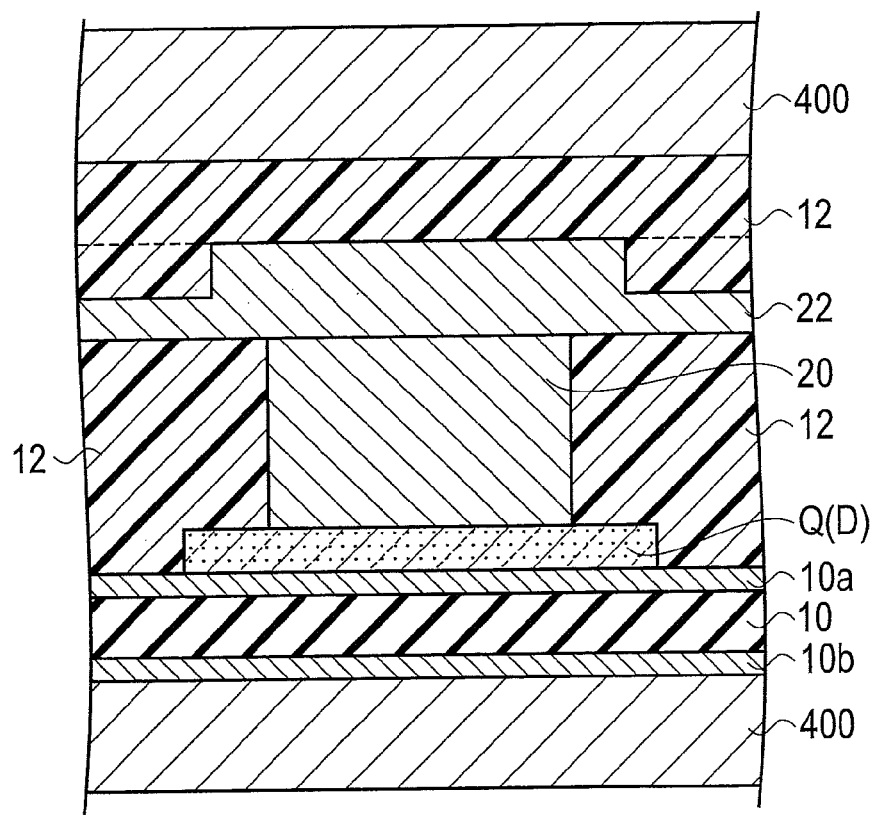
FIG. 27A is a schematic cross-sectional structure diagram showing a power module semiconductor device according to a third embodiment.
Figure 27B:
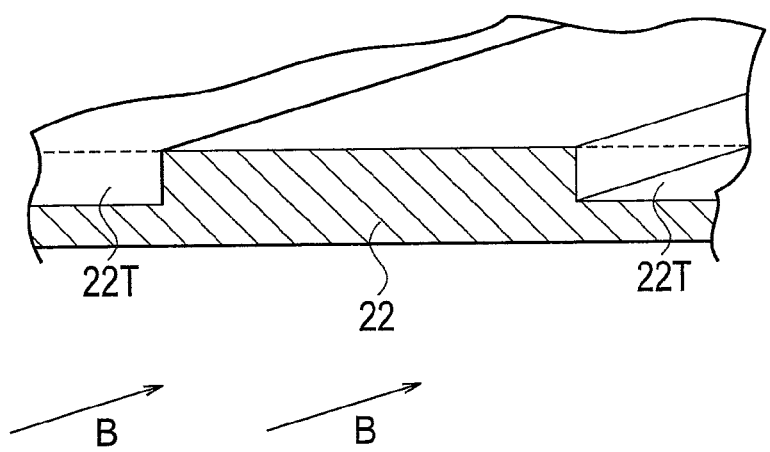
FIG. 27B is a schematic bird's-eye view configuration diagram of an upper surface plate electrode portion shown in FIG. 27A.

FIG. 27A illustrates a schematic cross-sectional structure of a power module semiconductor device according to a third embodiment, and FIG. 27B illustrates a schematic bird's-eye view configuration of an upper surface plate electrode portion of FIG. 27A.

Figure 28:
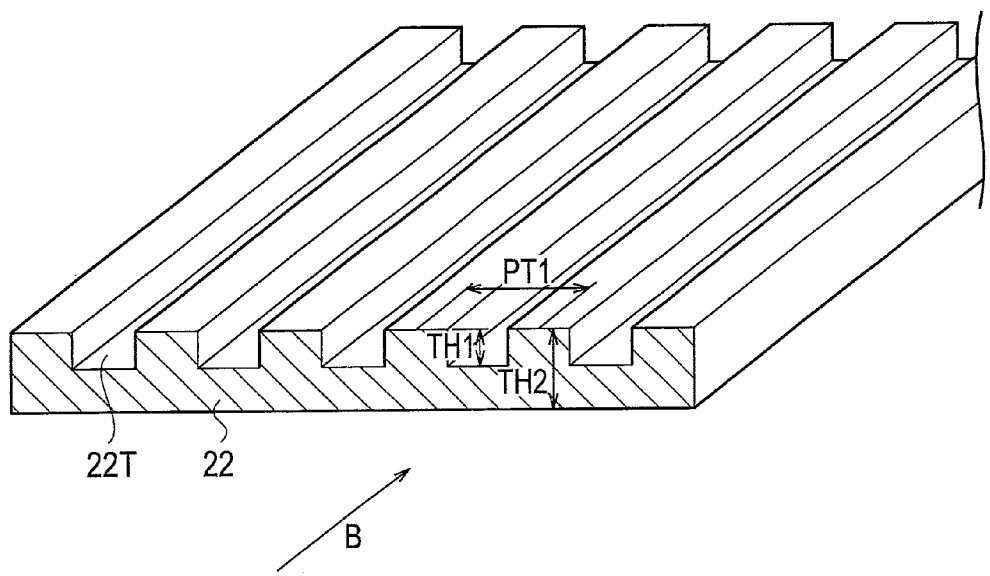
FIG. 28 is a schematic bird's-eye view configuration diagram of an upper surface plate electrode applicable to the power module semiconductor device according to the third embodiment.

FIG. 28 illustrates a schematic bird's-eye view configuration of the upper surface plate electrode applicable to the power module semiconductor device according to the third embodiment.

In the power module semiconductor device according to the third embodiment, a plurality of grooves 22T are formed in at least one surface of the first upper surface plate electrode $22_1$ and the second upper surface plate electrode $22_4$.

The grooves 22T can be used as guide grooves. When covering the whole device with transfermold resin, a ratio of cross-sectional area of a gap with a jig 400 set so that an outside of the device may be covered is relatively set up larger than that of an inside thereof. The guide grooves guide the transfermold resin injected into the gap portion.

The guide grooves 22T include stripe-shaped first grooves formed along an injecting direction B of the transfermold resin.

Moreover, the guide groove 22T may include a second groove for diffusion (for example, diffusion groove 22Ta shown in FIG. 30C) that intersects the stripe-shaped first groove, and diffuses the injected transfermold resin in multiple directions.

The grooves 22T can also be served as a heat sink at the time of operating the device.

As specifically shown in FIGS. 27A, 27B and 28, for example, when injecting the transfermold resin which forms the resin layer 12, a plurality of the guide grooves 22T are formed in order to guide a flow of the resin.

Note that, an epoxy based resin or a silicone based resin can be used as the transfermold resin.

As shown in FIGS. 27B and 28, each guide groove 22T is a stripe-shaped groove formed along the injecting direction B of the transfermold resin.

The size of the guide groove 22T formed as a stripe-shaped groove as shown in FIG. 28 is not in particular limited, but the width PT1 of the guide groove 22T may be from approximately 1 mm to approximately 1.5 mm, the depth TH1 of the groove may be from approximately 1 mm to approximately 2 mm, and the thickness TH2 of the upper surface plate electrode 22 may be approximately 2 mm, for example.

Note that the thickness TH2 of the upper surface plate electrode 22 and the depth TH1 of the guide groove 22T may be greater than the above-mentioned range for adjusting the warping amount of the power module.

In FIG. 27A, the same reference numerals are attached to the same configurations same as the power module semiconductor device according to the first embodiment and the second embodiment, and the detailed descriptions are omitted.

In FIG. 27A, the reference numeral 400 denotes a jig set so as to cover the outside of the power module semiconductor device, when covering the whole device with the transfermold resin to form the resin layer 12. The detailed configuration will be described below.

Figure 29:
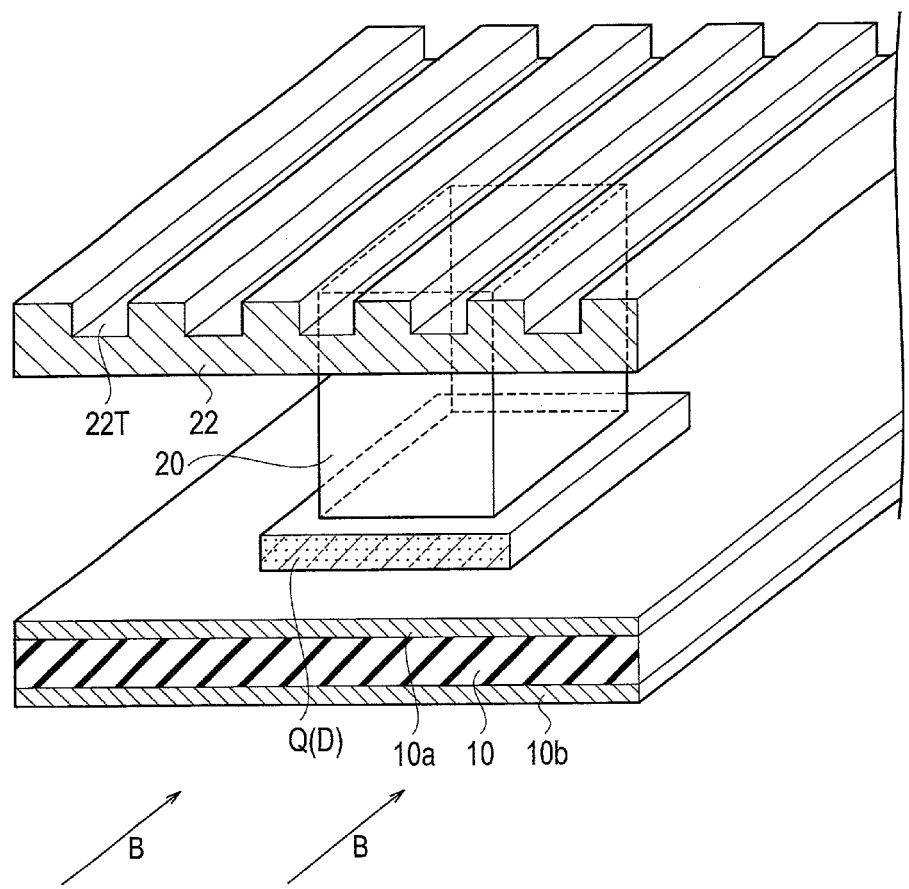
FIG. 29 is a schematic bird's-eye view configuration diagram showing the power module semiconductor device according to the third embodiment.

FIG. 29 illustrates a schematic bird's-eye view configuration of the power module semiconductor device according to the third embodiment. In FIG. 29, the arrow B indicates a resin embedding direction.

FIG. 29 shows a state before covering the power module semiconductor device with the transfermold resin. In this state, the upper surface plate electrode 22 on which a plurality of the guide grooves 22T are formed on a surface side is formed in a top surface of the pillar electrode 20 formed on the semiconductor chip Q(D). Note that each guide groove 22T is a stripe-shaped groove formed along the resin embedding direction B.

(Upper Surface Plate Electrode)

Figure 30A:
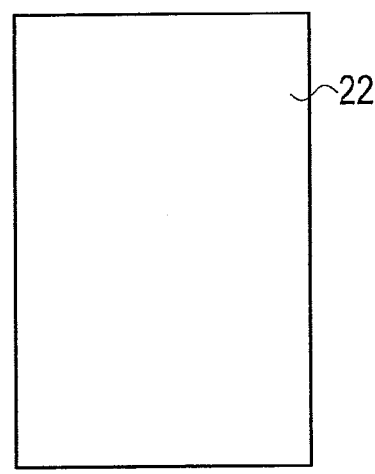
FIG. 30A is a planar pattern configuration diagram showing an upper surface plate electrode according to a comparative example.
Figure 30B:
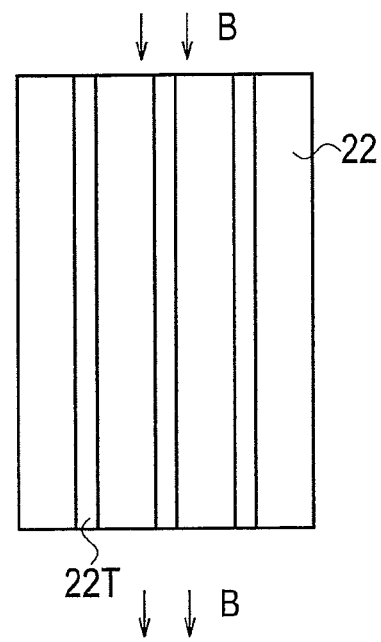
FIG. 30B shows a constructional example of the upper surface plate electrode applicable to the power module semiconductor device according to the third embodiment.
Figure 30C:
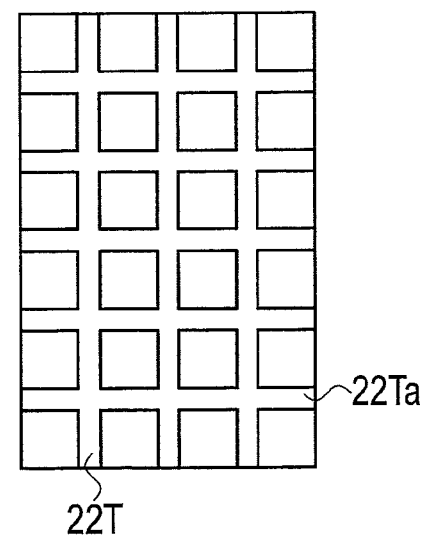
FIG. 30C shows another constructional example of the upper surface plate electrode applicable to the power module semiconductor device according to the third embodiment.

FIG. 30A illustrates a planar pattern configuration of the upper surface plate electrode 22 in a comparative example, and FIGS. 30B and 30C illustrate a constructional example and another constructional example of the upper surface plate electrode applicable to the power module semiconductor device according to the third embodiment.

As shown in FIG. 30A, the upper surface plate electrode 22 according to the comparative example is a flush plate, and grooves are not formed thereon.

Therefore, when covering the whole device with the transfermold resin, the cross-sectional area of gap between the jig 400 set so as to cover the outside of the device and the upper surface plate electrode 22 is relatively smaller, and a resistance at the time of resin injection is higher. Accordingly, the flow velocity of the resin above the upper surface plate electrode 22 (i.e., the gap between the upper surface plate electrode 22 and the jig 400) becomes slower due to the resistance than the flow velocity of the resin below the upper surface plate electrode 22 (i.e., a side on which the pillar electrode 20 etc. are formed), at the time of the resin injection, thereby producing a resin non-filled portion as a result.

On the other hand, as shown in FIG. 30B, a plurality of the guide grooves 22T (e.g., three guide grooves in FIG. 30B) composed of stripe-shaped grooves along the resin embedding direction B is formed, according to the constructional example according to the third embodiment. The resistance at the time of resin injection can be reduced by using the guide groove 22T since the cross-sectional area of gap between the jig 400 and the upper surface plate electrode 22 becomes larger than that of the case shown in FIG. 30A. Accordingly, the flow velocity of the resin below the upper surface plate electrode 22 can be almost equal to the flow velocity of the resin above the upper surface plate electrode 22 at the time of the resin injection by suitably controlling the size of the guide groove 22T, thereby preventing producing of such a resin non-filled portion.

Moreover, the plurality of guide grooves 22T composed of the stripe-shaped grooves along the resin embedding direction B, and diffusion grooves 22Ta which intersect the guide grooves 22T are formed, in the constructional example according to the third embodiment, as shown in FIG. 30C. The resistance at the time of resin injection can be reduced by using the guide groove 22T and the diffusion grooves 22Ta since the cross-sectional area of gap between the jig 400 and the upper surface plate electrode 22 becomes larger than that of the case shown in FIG. 30A. Accordingly, the flow velocity of the resin below the upper surface plate electrode 22 can be almost equal to the flow velocity of the resin above the upper surface plate electrode 22 at the time of the resin injection by controlling suitably the size of the guide grooves 22T and the size of the diffusion grooves 22Ta, thereby more effectively preventing producing of the resin non-filled portion.

Moreover, in the constructional example shown in FIGS. 30B and 30C, the guide groove 22T and the diffusion groove 22Ta formed on the upper surface plate electrode 22 can also function as a heat sink at the time of operating the power module semiconductor device. More specifically, it is expected that the thermal dispersion effect is improved expected, since the surface area of the upper surface plate electrode 22 becomes larger by forming the guide groove 22T and the diffusion groove 22Ta.

Since the surface area of the upper surface plate electrode 22 becomes larger by forming the guide groove 22T and the diffusion groove 22Ta, the contact area with the resin layer 12 also increases, thereby also improving the adhesibility with the resin layer 12 due to the anchor effect.

(Processing Step of Resin Embedding)

Figure 31:
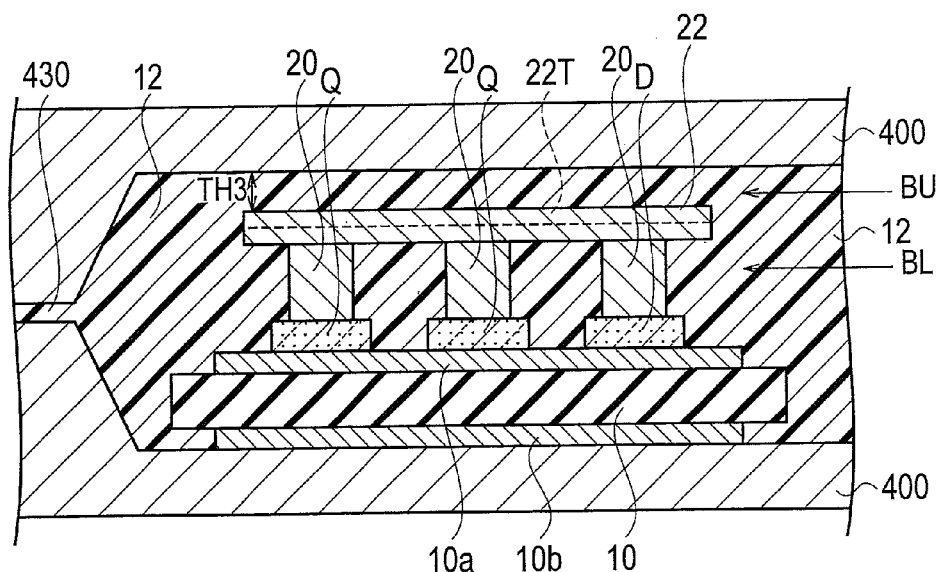
FIG. 31 is a side surface configuration diagram illustrating a processing step of performing resin embedding of a device disposed in a jig in order to inject a transfermold resin therein, in the power module semiconductor device according to the third embodiment.

FIG. 31 shows a side surface configuration illustrating a processing step of resin embedding of the device disposed in the jig 400 in order to inject the transfermold resin therein, in the power module semiconductor device according to the third embodiment.

In the power module semiconductor device according to the third embodiment provided with the upper surface plate electrode 22 according to the constructional example shown in FIG. 30B or 30C, the transfermold resin 12 composed of an epoxy based resin or a silicone based resin is injected along a direction BU, BL from the right-hand side to the left-hand side on the drawing, after disposing the whole device in the jig 400. Note that a venting hole 430 for venting the air in the jig 400 is formed at a left edge portion of the jig 400.

Moreover, the distance TH3 between the upper surface plate electrode 22 and the internal wall of the jig 400 may be approximately 0.3 mm to approximately 0.5 mm, for example. As mentioned above, the cross-sectional area of gap of a side into which the resin flows is comparatively larger by forming the guide grooves 22T and the diffusion grooves 22Ta on the upper surface plate electrode 22 according to the constructional example shown in FIG. 30B or 30C, thereby reducing the resistance with respect to the resin injection.

Accordingly, the flow velocity of the resin along the inflow direction BL below the upper surface plate electrode 22 can be almost equal to the flow velocity of the resin along the inflow direction BU above the upper surface plate electrode 22, and thereby producing of the resin non-filled portion can be prevented, and the whole device can be fully covered with the resin layer 12.

After the transfermold resin 12 composed of the epoxy based resin or silicone based resin is hardened, the power module semiconductor device fully covered with the resin layer 12 can be obtained by removing the jig 400.

Figure 32:
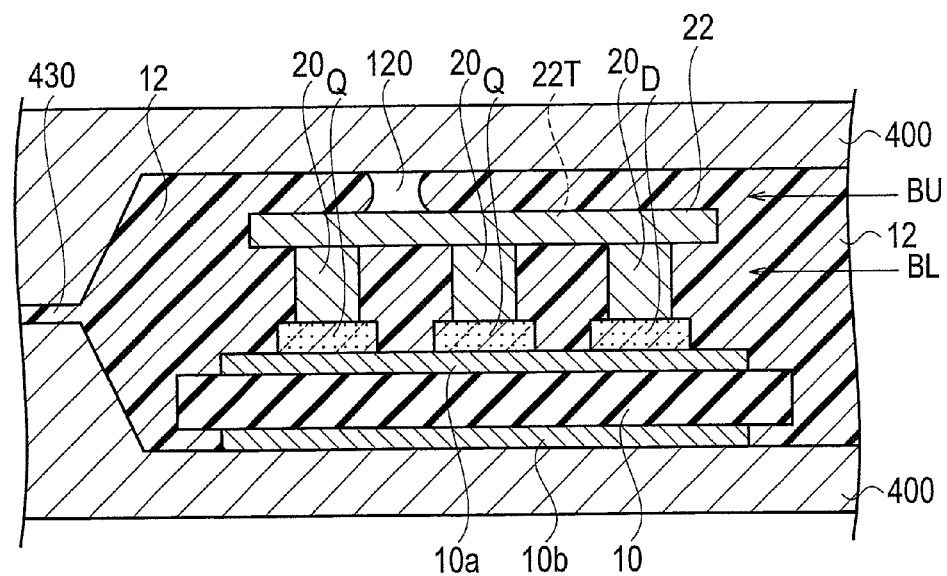
FIG. 32 is a sectional side configuration diagram illustrating a processing step of performing resin embedding of the device disposed in the jig in order to inject the transfermold resin therein, in the case of the upper surface plate electrode according to the comparative example.

FIG. 32 shows a sectional side configuration diagram illustrating a processing step of performing resin embedding of the device disposed in the jig 400 in order to inject the transfermold resin therein, in the case of the upper surface plate electrode 22 according to the comparative example.

As mentioned above, the cross-sectional area of gap between the internal wall of the jig 400 and the upper surface plate electrode 22 according to the comparative example is relatively smaller, and therefore the resistance thereof at the time of resin injection is higher. Accordingly, the flow velocity of the resin in the inflow direction BU above the upper surface plate electrode 22 becomes slower than the flow velocity of the resin in the inflow direction BL below the upper surface plate electrode 22 due to the resistance at the time of the resin injection, thereby producing the resin non-filled portion 120 as a result. Accordingly, defects, e.g. a hole or hollow, will be produced on the surface of the resin layer 12 due to the existence of the non-filled portion 120 when the jig 400 is removed after the transfermold resin 12 is hardened, and thereby the sealing state will be less than perfect.

Figure 33:
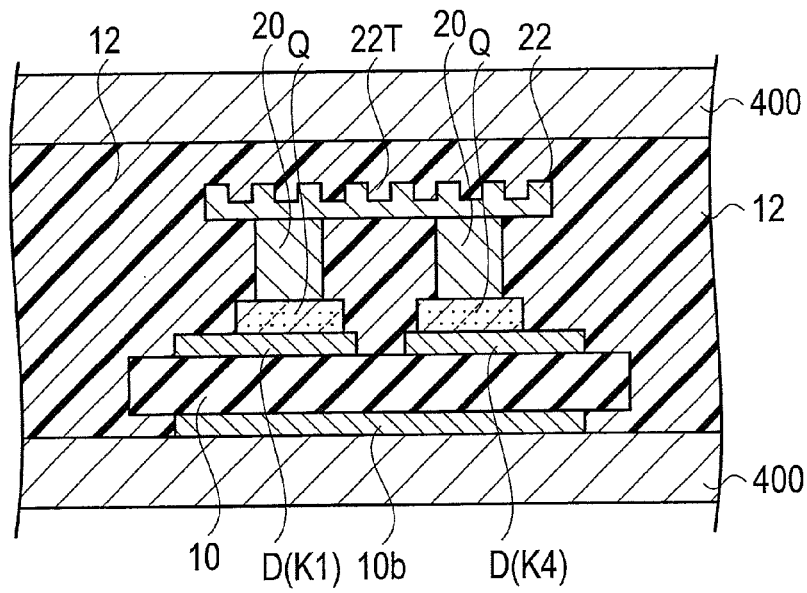
FIG. 33 is a sectional front configuration diagram illustrating a processing step of performing resin embedding of a device disposed in the jig in order to inject the transfermold resin therein, in the power module semiconductor device according to the third embodiment.

FIG. 33 is a sectional front configuration diagram illustrating a processing step of performing resin embedding of the device disposed in the jig 400 in order to inject the transfermold resin 12 therein, in the power module semiconductor device according to the third embodiment.

As shown in FIG. 33, since the guide grooves 22T are formed on the upper surface plate electrode 22, the cross-sectional area of gap in the side into which the resin flows is larger than that of the upper surface plate electrode according to the comparative example in which no guide groove is formed as shown in FIG. 30A. Accordingly, the resistance at the time of the resin injection is reduced, thereby preventing producing of the resin non-filled portion.

Modified Example 1

Figure 34:
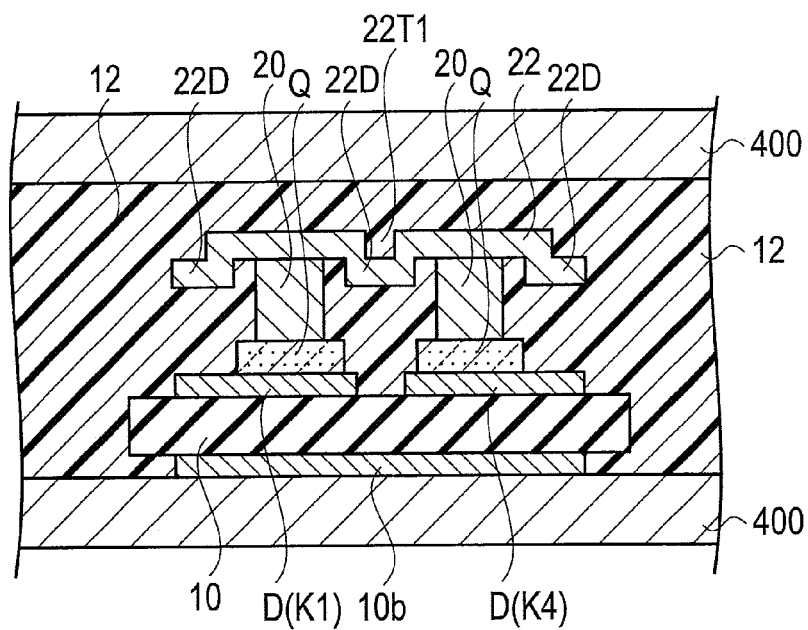
FIG. 34 is a sectional front configuration diagram illustrating a processing step of performing resin embedding of a device disposed in the jig in order to inject the transfermold resin therein, in a power module semiconductor device according to a modified example 1 of the third embodiment.

FIG. 34 is a sectional front configuration diagram illustrating a processing step of performing resin embedding of the device disposed in the jig 400 in order to inject the transfermold resin therein, in a power module semiconductor device according to a modified example 1 of the third embodiment.

In the modified example 1 shown in FIG. 34, the guide groove 22T1 is formed in the surface side of the upper surface plate electrode 22, and a projecting portion 22D extended for a predetermined length in a downward direction is formed on the back side surface of the upper surface plate electrode 22. More specifically, the projecting portion 22D extended in a direction away from the upper surface plate electrode 22 is formed.

Accordingly, the cross-sectional area of gap above the upper surface plate electrode 22 can be relatively increased, and the cross-sectional area of the space below the upper surface plate electrode 22 can be reduced. Accordingly, the absolute quantity of the resin can be almost equal to that in the case where no guide groove 22T1 and no projecting portion 22D are formed by suitably controlling the size of the guide groove 22T1 and the size of the projecting portion 22D, thereby avoiding a situation that a warpage occurs in a completed power module semiconductor device.

Moreover, the projecting portion 22D is preferable to be formed so as to avoid a gate sense bonding wire, a source sense bonding wire, etc. More specifically, it is possible to reduce the cross-sectional area below the upper surface plate electrode 22 as the height of the pillar electrode is reduced, but it is difficult to reduce the height of the pillar electrode 20 due to the existence of a gate sense bonding wire, a source sense bonding wire, etc. Accordingly, it is preferable to form partially concavity and convexity structure, picking out locations.

The ratio of sectional areas above and below the upper surface plate electrode 22 can be reduced, while the resistance of the upper surface plate electrode 22 kept up, by relatively increasing the cross-sectional area of gap above the upper surface plate electrode 22 and reducing the cross-sectional area of the space below the upper surface plate electrode 22.

Moreover, it is also possible to control the warpage since the structure which does not increase the absolute quantity of the resin 12 can be achieved by relatively increasing the cross-sectional area of gap above the upper surface plate electrode 22 and reducing the cross-sectional area of the space below the upper surface plate electrode 22.

Moreover, in the modified example 1 shown in FIG. 34, since the thickness of the whole upper surface plate electrode 22 is securable, it is avoidable that the electric resistance of the upper surface plate electrode 22 itself becomes higher.

Modified Example 2

Figure 35:
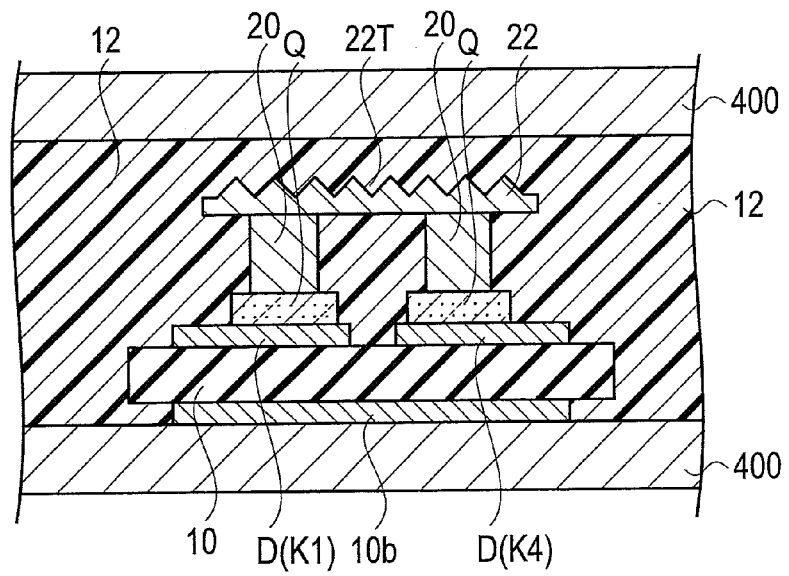
FIG. 35 is a sectional front configuration diagram illustrating a processing step of performing resin embedding of a device disposed in the jig in order to inject the transfermold resin therein, in a power module semiconductor device according to a modified example 2 of the third embodiment.

FIG. 35 is a sectional front configuration diagram illustrating a processing step of performing resin embedding of the device disposed in the jig 400 in order to inject the transfermold resin therein, in a power module semiconductor device according to a modified example 2 of the third embodiment.

In a modified example 2 shown in FIG. 35, a ridge shape and a valley shape are serially formed one another on the upper surface plate electrode 22, instead of the guide groove 22T shown in FIG. 33 etc. of which the cross-sectional shape is rectangular shape. Accordingly, the guide groove 22T is formed as a valley shape. Also according to the guide groove 22T formed as a valley shape shown in the modified example 2, the cross-sectional area of gap in the side into which the resin flows can be larger than that of the upper surface plate electrode according to the comparative example in which no guide groove is formed thereon shown in FIG. 30A. Accordingly, the resistance at the time of the resin injection is reduced, thereby preventing producing of the resin non-filled portion.

Moreover, it can be expected that the thermal dispersion effect is improved since the surface area of the upper surface plate electrode 22 becomes larger. Furthermore, since the surface area of the upper surface plate electrode 22 becomes larger by forming the valley-shaped guide groove 22T, the contact area with the resin layer 12 also increases, thereby also improving the adhesibility with the resin layer 12 due to the anchor effect.

Modified Example 3

Figure 36:
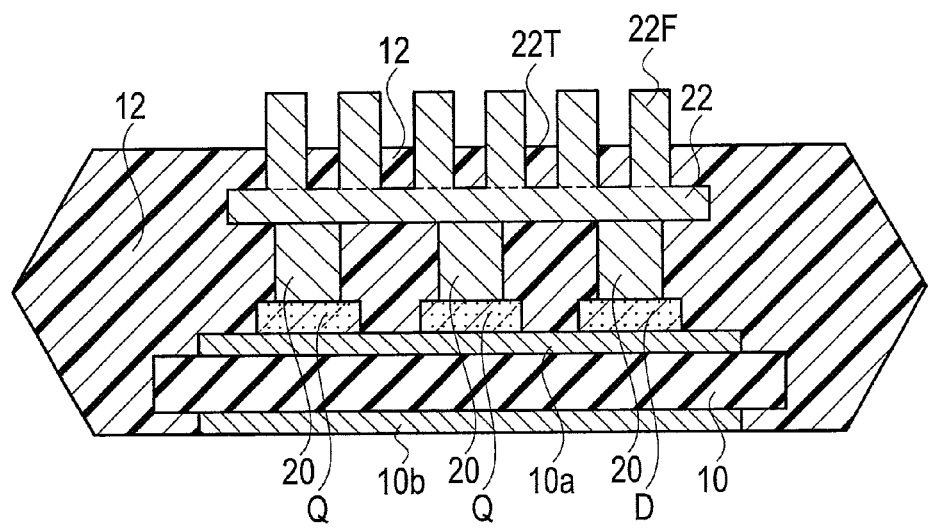
FIG. 36 is a sectional side configuration diagram showing a power module semiconductor device resin-sealed with the transfermold resin, according to a modified example 3 of the third embodiment.

FIG. 36 is a sectional side configuration diagram showing a power module semiconductor device resin-sealed with the transfermold resin, according to a modified example 3 of the third embodiment.

The guide groove 22T also functions as a heat sink at the time of operating the power module semiconductor device, in the modified example 3.

More specifically, at least a part of the wall 22F which is upright adjacent to the guide groove 22T is exposed to outside from the resin layer 12.

Accordingly, heat generated at the time of operating the power module semiconductor device can be efficiently escaped to outside via the wall 22F.

Modified Example 4

Figure 37:
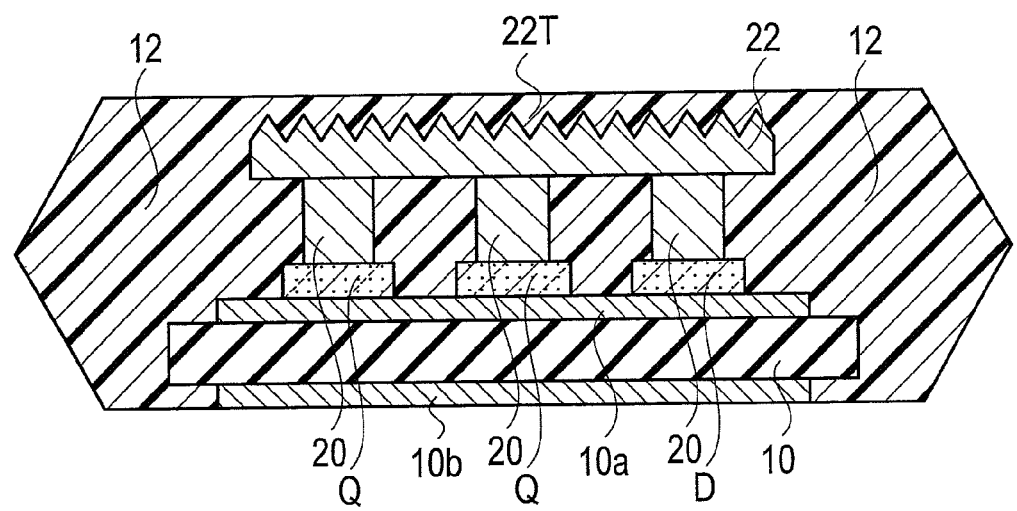
FIG. 37 is a sectional side configuration diagram showing a power module semiconductor device resin-sealed with the transfermold resin, according to a modified example 4 of the third embodiment.

FIG. 37 is a sectional side configuration diagram showing a power module semiconductor device resin-sealed with the transfermold resin, according to a modified example 4 of the third embodiment.

The modified example 4 has a structure obtained when the gap distance between the jig 400 and the upper surface plate electrode 22 is smaller, in the configuration shown in above-mentioned FIG. 33.

According to the structure of the modified example 4, the upper surface plate electrode 22 with relatively larger surface area having the surface shape of a ridge shape and a valley shape (groove 22T) being serially formed one another is positioned near the surface of the resin layer 12, and thereby the heat generated at the time of operating the power module semiconductor device can be efficiently escaped to outside.

Fourth Embodiment

Figure 38:
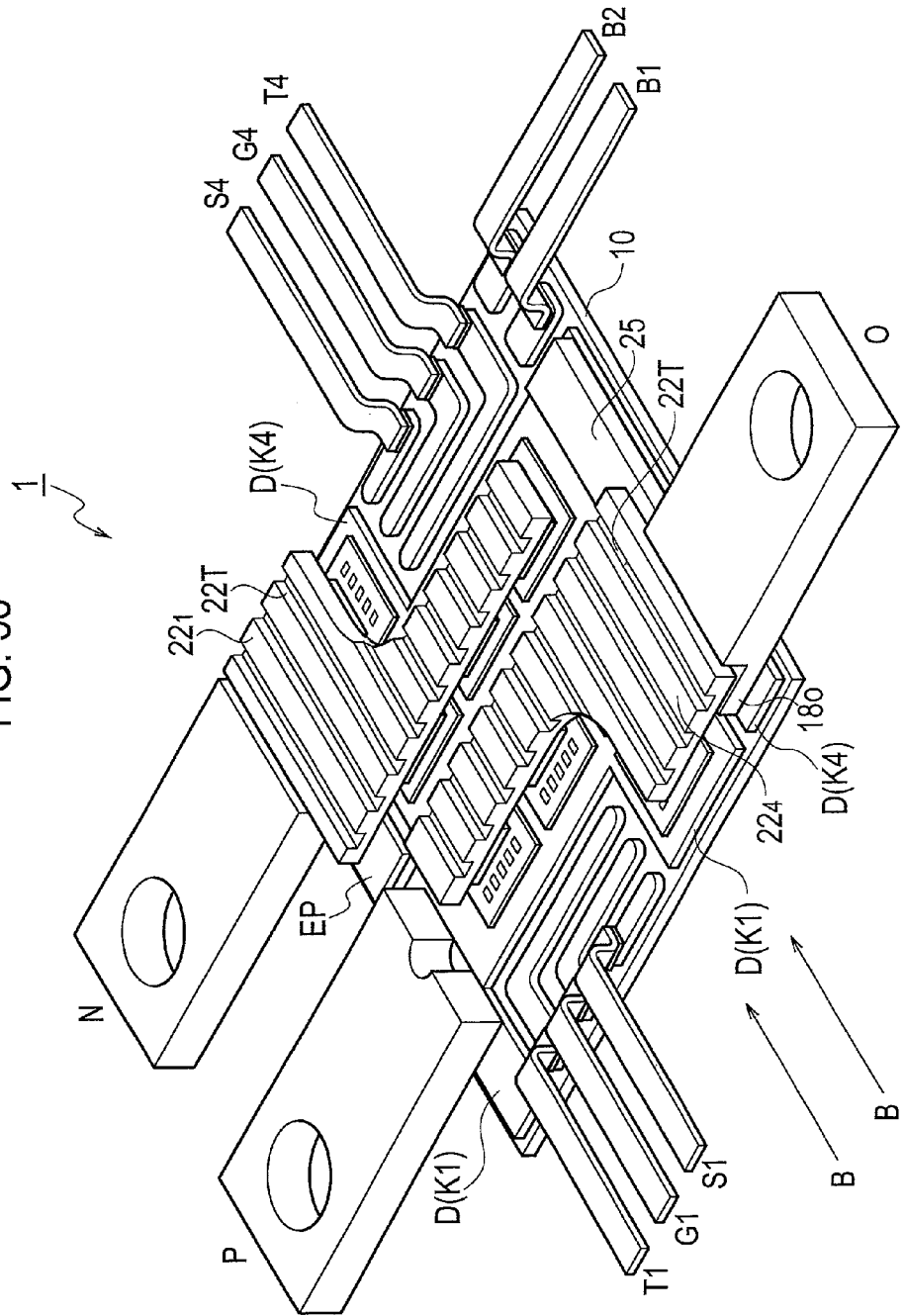
FIG. 38 is a schematic bird's-eye view configuration diagram showing a 2-in-1 module, which is a power module semiconductor device according to the fourth embodiment, before forming a resin layer thereon.
Figure 39:
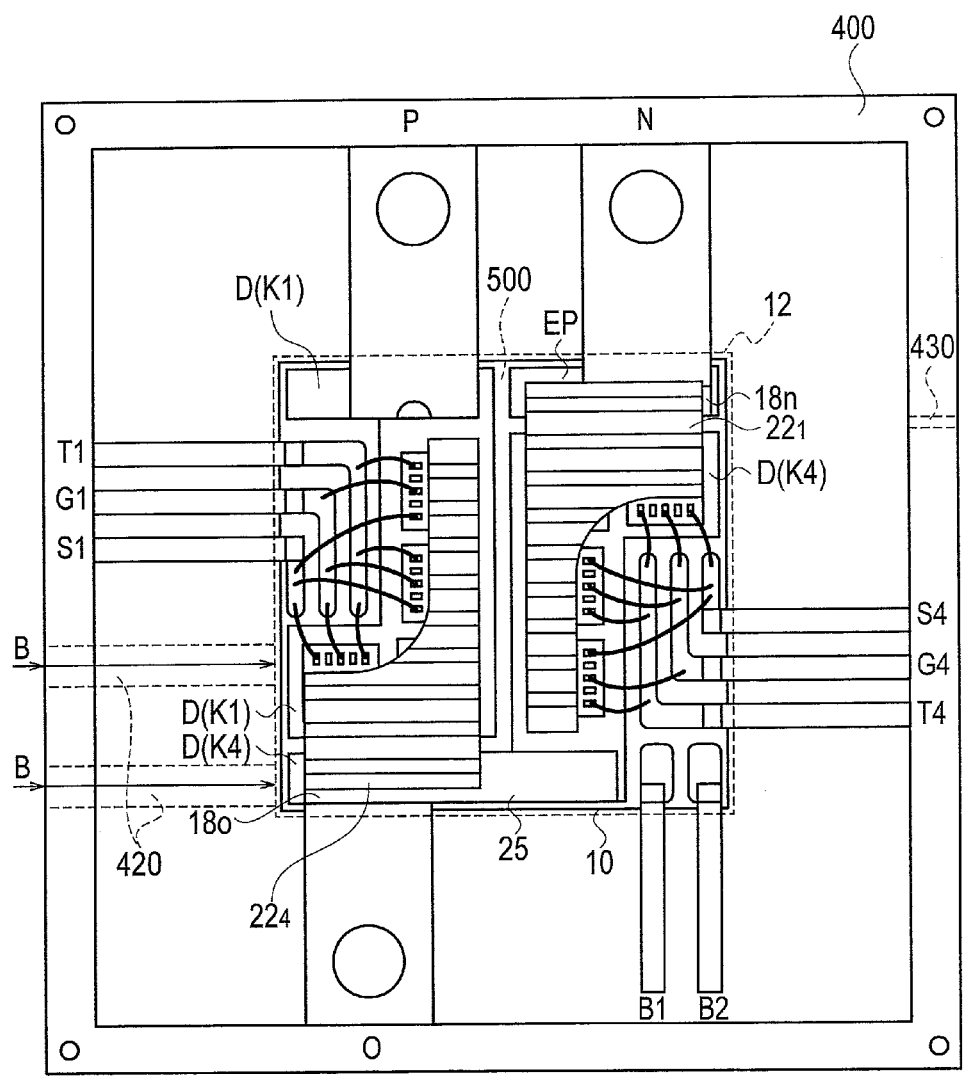
FIG. 39 is a plane configuration diagram of the power module semiconductor device according to the fourth embodiment in which a device is disposed in a jig in order to inject a transfermold resin therein.

FIGS. 38 and 39 illustrate a power module semiconductor device according to a fourth embodiment.

FIG. 38 is a schematic bird's-eye view configuration diagram before forming a resin layer 12 on a 2-in-1 module 1, which is the power module semiconductor device according to the fourth embodiment. FIG. 39 is a plane configuration diagram in which a device is disposed in a jig 400 in order to inject the transfermold resin therein.

As shown in FIG. 38, upper surface plate electrodes $22_1$, $22_4$ provided with stripe-shaped guide grooves 22T are formed on the device, in the power module semiconductor device 1 according to the fourth embodiment. As mentioned above, the guide grooves 22T are formed along an injecting direction B of the transfermold resin.

As shown in FIG. 39, the jig 400 into which the transfermold resin 12 is injected includes: a conducting hole 420 of the transfermold resin 12, and a cavity 500 into which the transfermold resin 12 is injected, the cavity 500 connected to the conducting hole 420. The jig 400 is formed from a metal block which can be divided upward and downward. FIG. 39 shows a plane configuration of a lower side metal block. Although an upper side metal block is not shown in drawings, the upper side metal block is combined with the lower side metal block so that only a conducting hole 420 and a cavity 500 becomes a cavity portion.

In FIG. 39, the reference numeral 430 denotes a venting hole for venting an air in the cavity 500 at the time when the transfermold resin 12 is injected.

According to the power module semiconductor device 1 according to the fourth embodiment, since the guide grooves 22T are formed on the upper surface plate electrodes $22_1$, $22_4$, the cross-sectional area of gap with the jig 400 side into which the transfermold resin 12 flows becomes larger than that in the case where no guide groove is formed thereon. Accordingly, the resistance at the time of injection of the transfermold resin 12 is reduced, thereby preventing producing of the resin non-filled portion.

Figure 40:
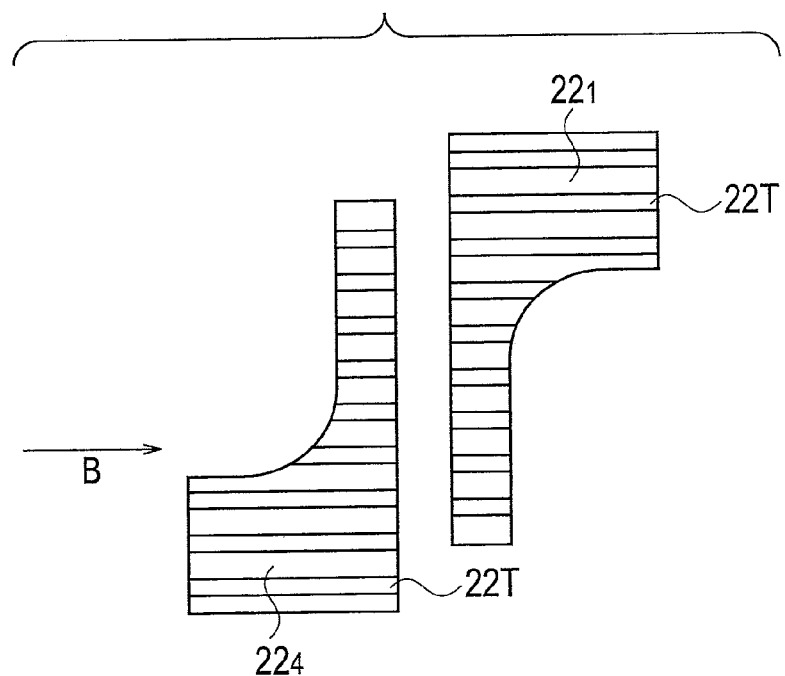
FIG. 40 is a schematic planar pattern configuration diagram showing an upper surface plate electrode, in the power module semiconductor device according to the fourth embodiment.

FIG. 40 is a schematic planar pattern configuration diagram showing the upper surface plate electrodes $22_1$, $22_4$, in the power module semiconductor device 1 according to the fourth embodiment.

As shown in FIG. 40, a plurality of the stripe-shaped guide grooves 22T are formed on the surface of the upper surface plate electrodes $22_1$, $22_4$. Each guide groove 22T is formed along the injecting direction B of the transfermold resin. Although the size of the guide groove 22T is not in particular limited, the width of the guide groove 22T may be approximately 1 mm to approximately 2 mm, and the depth of the guide groove 22T may be approximately 1 mm to approximately 1.5 mm, for example.

Figure 41:
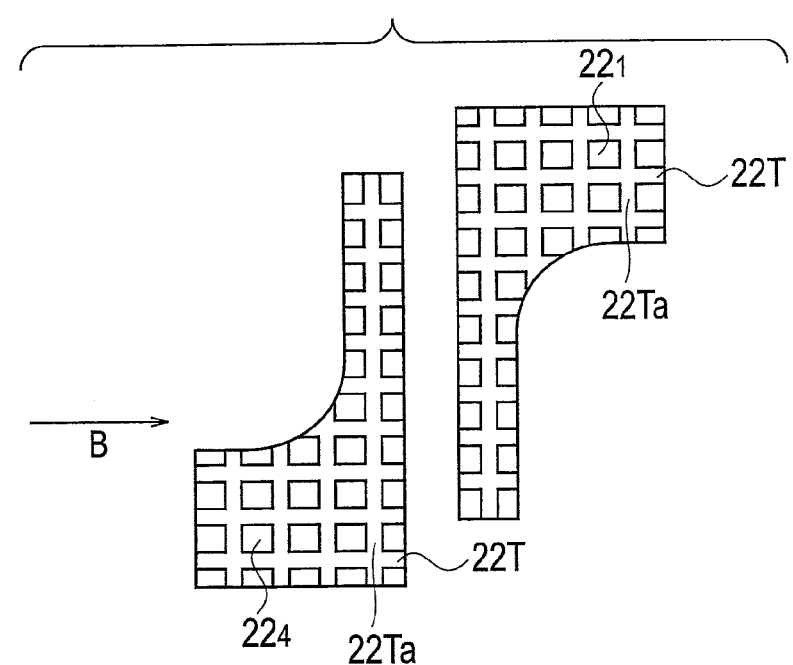
FIG. 41 is a schematic planar pattern configuration diagram showing another upper surface plate electrode, in the power module semiconductor device according to the fourth embodiment.

FIG. 41 is a schematic planar pattern configuration diagram of other upper surface plate electrodes $22_1$, $22_4$, in the power module semiconductor device 1 according to the fourth embodiment.

As shown in FIG. 41, the plurality of the stripe-shaped guide grooves 22T, and diffusion grooves 22Ta which intersect the guide grooves 22T are formed on the surface of the upper surface plate electrodes $22_1$, $22_4$. Note that the guide grooves 22T are formed along the injecting direction B of the transfermold resin.

Fifth Embodiment

FIGS. 42-45 illustrate a power module semiconductor device according to a fifth embodiment.

Figure 42:
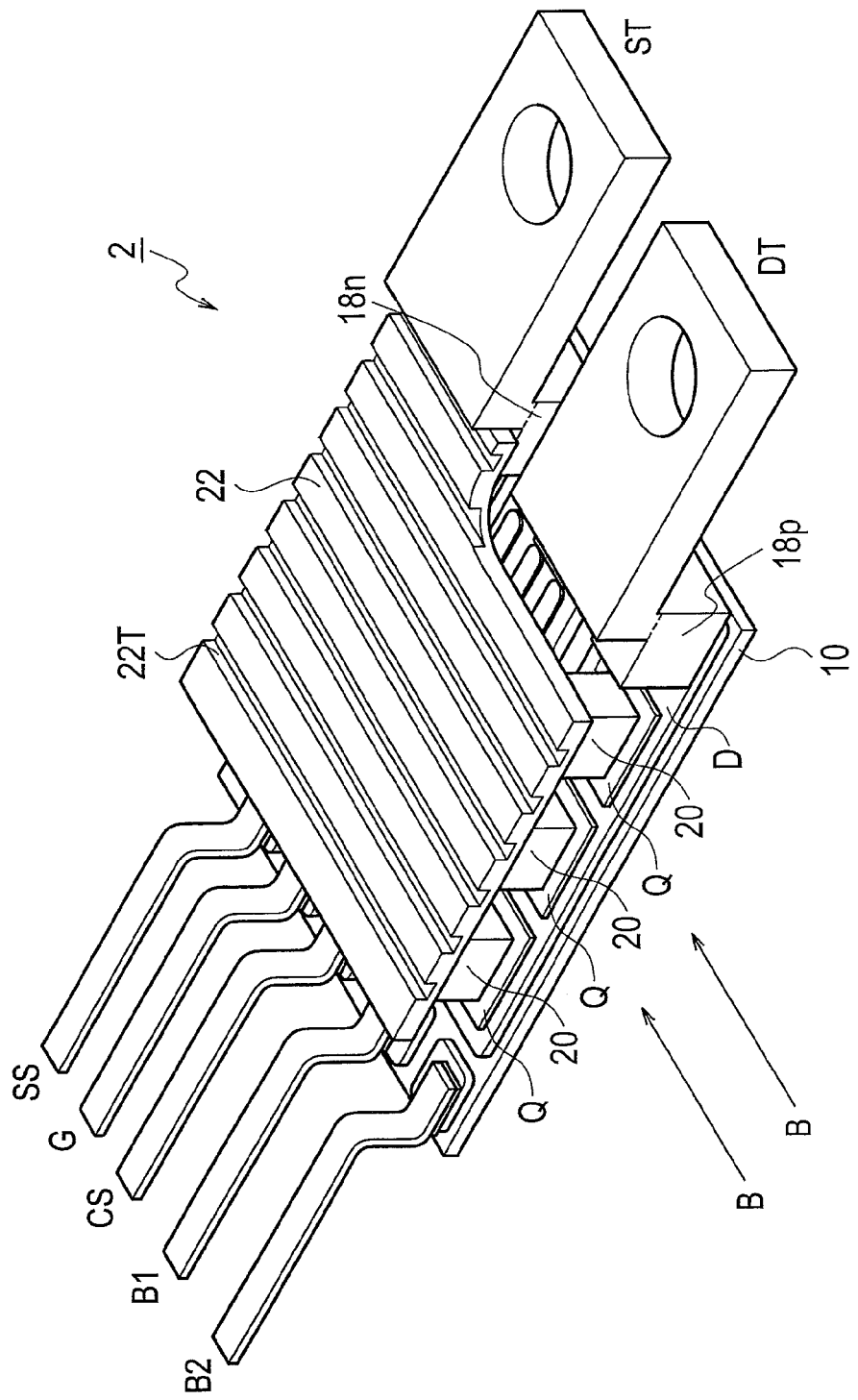
FIG. 42 is a schematic bird's-eye view configuration diagram showing a 1-in-1 module, which is a power module semiconductor device according to a fifth embodiment, before forming a resin layer thereon.
Figure 43:
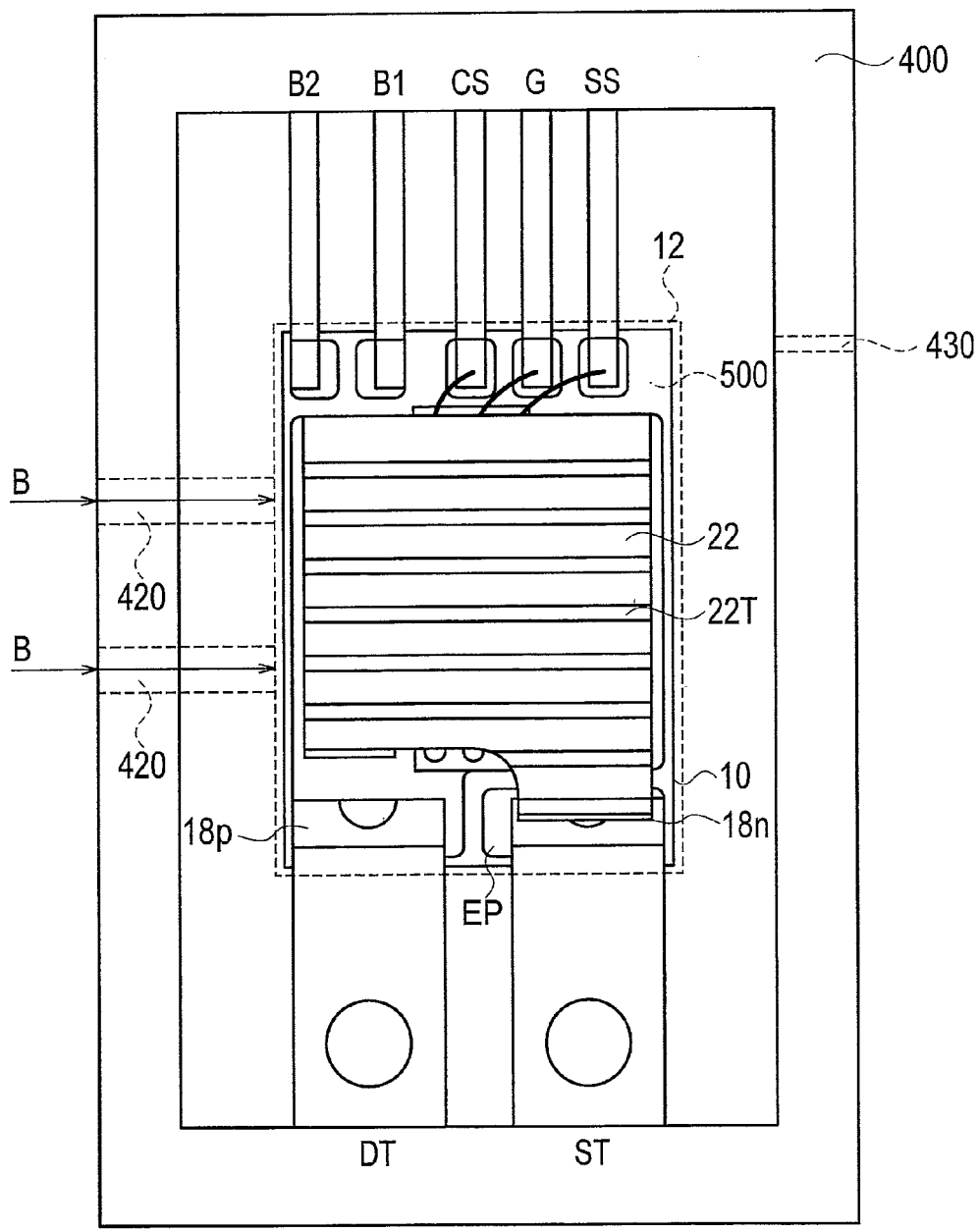
FIG. 43 is a plane configuration diagram of the power module semiconductor device according to the fifth embodiment in which a device is disposed in a jig in order to inject a transfermold resin therein.

FIG. 42 is a schematic bird's-eye view configuration diagram showing a 1-in-1 module, which is the power module semiconductor device 2 according to the fifth embodiment, before forming a resin layer thereon. FIG. 43 is a plane configuration diagram of the power module semiconductor device 2 according to the fifth embodiment in which a device is disposed in a jig in order to inject the transfermold resin therein.

As shown in FIG. 42, in the power module semiconductor device 2 according to the fifth embodiment, one sheet of upper surface plate electrode 22 on which stripe-shaped guide grooves 22T are formed is disposed on the device. As mentioned above, the guide grooves 22T are formed along the injecting direction B of the transfermold resin.

As shown in FIG. 43, the jig 400 into which the transfermold resin 12 is injected includes: a conducting hole 420 of the transfermold resin 12, and a cavity 500 into which the transfermold resin 12 is injected, the cavity 500 connected to the conducting hole 420. The jig 400 is formed from a metal block which can be divided upward and downward. A plane configuration of a lower side metal block is shown in FIG. 43. Although an upper side metal block is not shown in drawings, the upper side metal block is combined with the lower side metal block so that only a conducting hole 420 and a cavity 500 becomes a cavity portion.

In FIG. 43, the reference numeral 430 denotes a venting hole for venting an air in the cavity 500 at the time when the transfermold resin 12 is injected.

According to the power module semiconductor device 2 according to the fifth embodiment, since the guide grooves 22T are formed on the upper surface plate electrode 22, the cross-sectional area of gap with the jig 400 side into which the transfermold resin 12 flows becomes larger than that in the case where no guide groove is formed thereon. Accordingly, the resistance at the time of injection of the transfermold resin 12 is reduced, thereby preventing producing of the resin non-filled portion.

Figure 44:
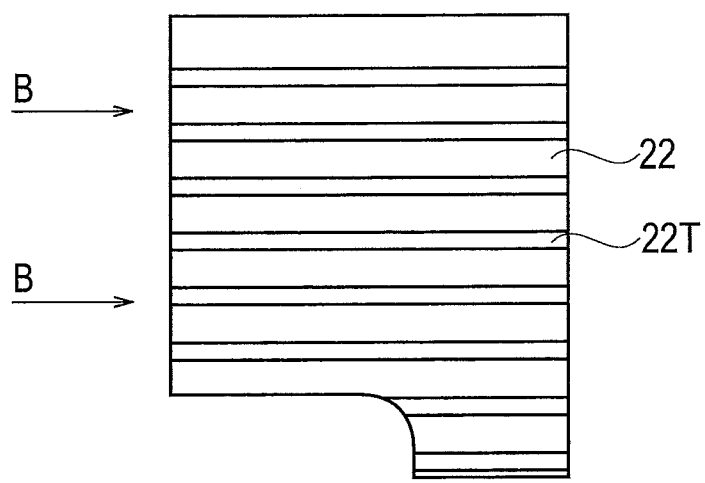
FIG. 44 is a schematic planar pattern configuration diagram showing an upper surface plate electrode, in the power module semiconductor device according to the fifth embodiment.

FIG. 44 is a schematic planar pattern configuration diagram showing the upper surface plate electrode 22, in the power module semiconductor device 2 according to the fifth embodiment.

As shown in FIG. 44, a plurality of the stripe-shaped guide grooves 22T are formed on the surface of the upper surface plate electrodes 22. Each guide groove 22T is formed along the injecting direction B of the transfermold resin. Although the size of the guide groove 22T is not in particular limited, the width of the guide groove 22T may be approximately 1 mm to approximately 2 mm, and the depth of the guide groove 22T may be approximately 1 mm to approximately 1.5 mm, for example.

Figure 45:
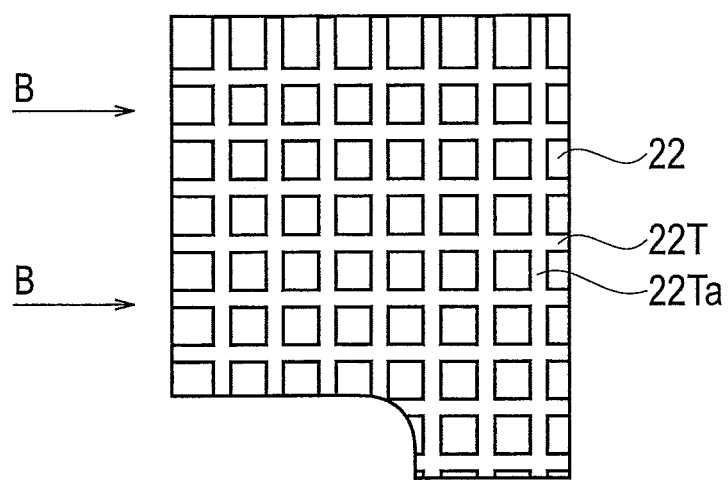
FIG. 45 is a schematic planar pattern configuration diagram showing another upper surface plate electrode, in the power module semiconductor device according to the fifth embodiment.

FIG. 45 is a schematic planar pattern configuration diagram showing another upper surface plate electrode 22, in the power module semiconductor device 2 according to the fifth embodiment.

As shown in FIG. 45, the plurality of the stripe-shaped guide grooves 22T, and diffusion grooves 22Ta which intersect the guide grooves 22T are formed on the surface of the upper surface plate electrodes 22T. Note that the guide grooves 22T are formed along the injecting direction B of the transfermold resin.

Sixth Embodiment

Figure 46:
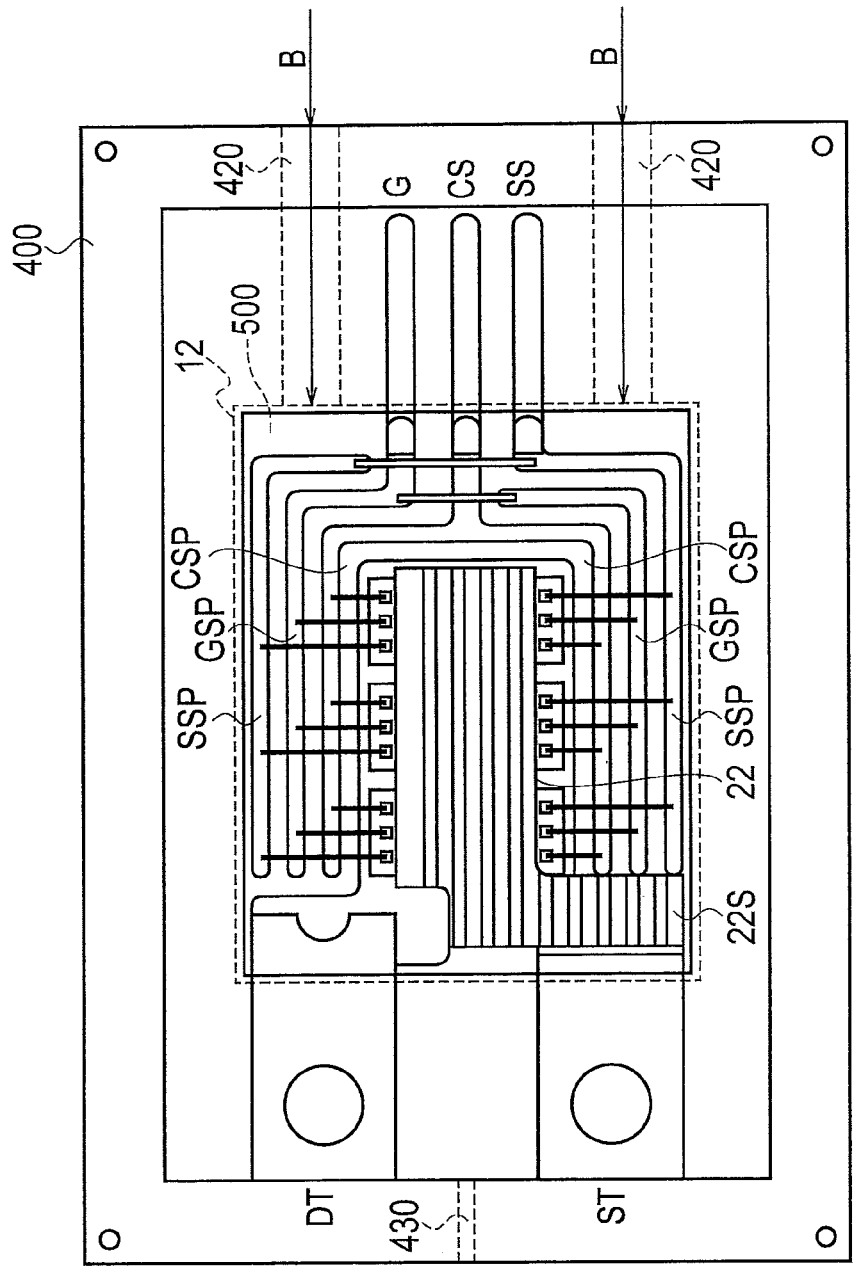
FIG. 46 is a plane configuration diagram of a power module semiconductor device according to a sixth embodiment, in which the device is disposed in the jig in order to inject the transfermold resin in a power module semiconductor device of another 1-in-1 module.
Figure 47:
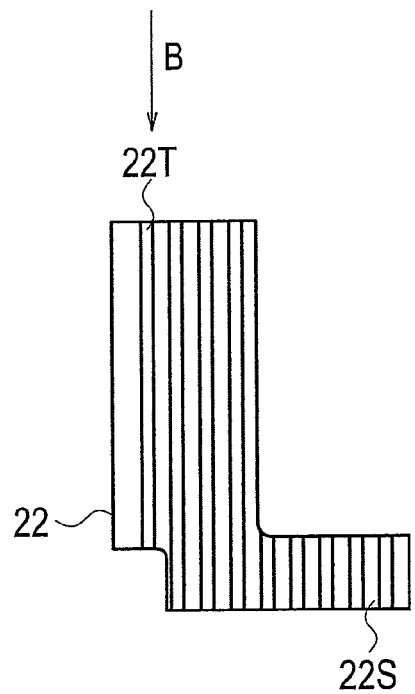
FIG. 47 is a schematic planar pattern configuration diagram showing an upper surface plate electrode, in the power module semiconductor device according to the sixth embodiment.
Figure 48:
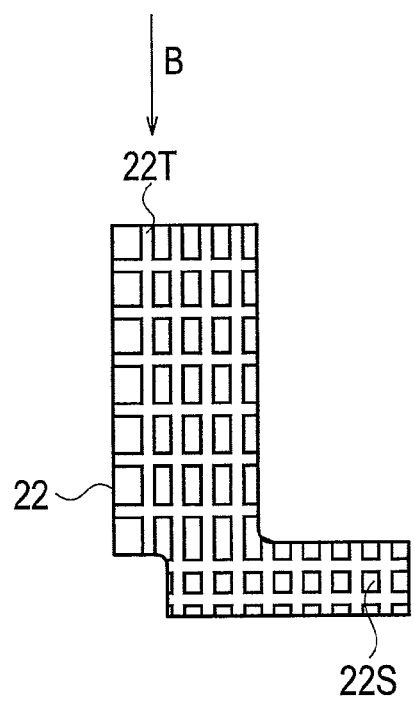
FIG. 48 is a schematic planar pattern configuration diagram showing another upper surface plate electrode, in the power module semiconductor device according to the sixth embodiment.

FIGS. 46-48 illustrate a power module semiconductor device according to a sixth embodiment.

FIG. 46 is a plane configuration diagram of the power module semiconductor device according to the sixth embodiment, in which a device is disposed in a jig 400 in order to inject a transfermold resin 12 in a power module semiconductor device of another 1-in-1 module.

Moreover, in the power module semiconductor device according to the sixth embodiment, as shown in FIG. 46, three chips of semiconductor chip Q are disposed in a center portion of the ceramic substrate 10 in two rows. Moreover, two-circuit groups of signal terminals (GSP, CSP, SSP) are respectively disposed in L-shaped structure on a peripheral part of the ceramic substrate 10. As shown in FIG. 46 the two-circuit groups of signal terminals (GSP, CSP, SSP) are connected in common to one another, and are also connected to a source sense terminal, a gate signal terminal, and a current sense terminal of the semiconductor chip Q.

A GP terminal, an SP terminal, and a CS terminal of each chip are connected with bonding wires to the groups of signal terminals (GSP, CSP, SSP) having L-shaped structure disposed on the peripheral part.

Furthermore, as shown in FIG. 46, the upper surface plate electrode 22, 22S is disposed so as to not cover directly above the group of bonding wires extended from the semiconductor chip Q, in planar view observed from the thickness direction of the ceramic substrate 10.

Since the group of signal terminals (GSP, CSP, SSP) is formed in L-shaped structure, it becomes possible to dispose wirings of the bonding wires from the tree-chips MOS transistor in a shorter distance without a cross-wiring. Furthermore, the upper surface plate electrode 22, 22S can also be disposed so as to not cover the bonding wires extended from the chips of the semiconductor chip.

As shown in FIG. 47, in the power module semiconductor device according to the sixth embodiment, one sheet of the upper surface plate electrode 22 on which a stripe-shaped guide groove 22T and a convexity portion 22S which is upright adjacent to the guide groove 22T are formed is disposed on the device. Note that the guide groove 22T and the convexity portion 22S are disposed along the injecting direction B of the transfermold resin. Moreover, at least a part of the convexity portion 22S which is upright adjacent to the guide groove 22T is exposed to outside from the resin layer 12.

Moreover, as shown in FIG. 46, the jig 400 into which the transfermold resin 12 is injected includes: a conducting hole 420 of the transfermold resin 12, and a cavity 500 into which the transfermold resin 12 is injected, the cavity 500 connected to the conducting hole 420. The jig 400 is formed from a metal block which can be divided upward and downward. FIG. 46 shows a plane configuration of a lower side metal block. Although an upper side metal block is not shown in drawings, the upper side metal block is combined with the lower side metal block so that only a conducting hole 420 and a cavity 500 becomes a cavity portion.

In FIG. 46, the reference numeral 430 denotes a venting hole for venting an air in the cavity 500 at the time when the transfermold resin 12 is injected.

According to the power module semiconductor device according to the sixth embodiment, since the guide grooves 22T are formed on the upper surface plate electrode 22, the cross-sectional area of gap with the jig 400 side into which the transfermold resin 12 flows becomes larger than that in the case where no guide groove is formed thereon. Accordingly, the resistance at the time of injection of the transfermold resin 12 is reduced, thereby preventing producing of the resin non-filled portion.

Moreover, since the convexity portion 22S also functions as a heat sink at the time of operating the power module semiconductor device, heat generated at the time when operating the power module semiconductor device can be efficiently escaped to outside via the convexity portion 22S.

FIG. 47 is a schematic planar pattern configuration diagram showing the upper surface plate electrode 22, in the power module semiconductor device according to the sixth embodiment.

As shown in FIG. 47, a plurality of the stripe-shaped guide grooves 22T and a plurality of the convexity portions 22S are formed on the surface of the upper surface plate electrodes 22. Each guide groove 22T and each convexity portion 22S are formed along the injecting direction B of the transfermold resin. Although the size of the guide groove 22T is not in particular limited, the width of the guide groove 22T may be approximately 1 mm to approximately 2 mm, and the depth of the guide groove 22T may be approximately 1 mm to approximately 1.5 mm, for example.

FIG. 48 is a schematic planar pattern configuration diagram showing another upper surface plate electrode 22, in the power module semiconductor device according to the sixth embodiment.

As shown in FIG. 48, a plurality of stripe-shaped guide grooves 22T and a plurality of quadrangular-shaped or rectangular-shaped convexity portions 22S are formed on the surface of the upper surface plate electrode 22.

As explained above, according to the present invention, there can be provided the power module semiconductor device allowing reduction of the warping amount of the thin type SiC power module.

Other Embodiments

The first to sixth embodiments has been described, as a disclosure including associated description and drawings to be construed as illustrative, not restrictive. This disclosure makes clear a variety of alternative embodiments, working examples, and operational techniques for those skilled in the art.

Such being the case, the present invention covers a variety of embodiments, whether described or not.

INDUSTRIAL APPLICABILITY

The power module semiconductor device according to the present invention is applicable to an overall power device, e.g. an SiC power semiconductor module, an intelligent power module, etc., and is applicable to wide applicable fields, in particular fields for which reduction in size and weight is required, e.g. an inverter, a converter, etc. used for in-vehicle and solar cells, industrial equipments, household equipments, etc.

What is claimed is:

1. A power module semiconductor device comprising:
a ceramic substrate;
a first pattern of a first copper plate layer disposed on a surface of the ceramic substrate;
a first semiconductor chip disposed on the first pattern;
a first pillar connection electrode disposed on the first pattern;
an output terminal connected to the first pillar connection electrode;
a first pillar electrode disposed on the first semiconductor chip;
a first diode disposed on the first pattern so as to be adjacent to the first semiconductor chip; and
a first upper surface plate electrode disposed on the first pillar electrode, the first upper surface plate electrode connected to an anode electrode of the first diode.

2. The power module semiconductor device according to claim 1 further comprising:
a second pattern of the first copper plate layer;
a second pillar connection electrode disposed on the second pattern; and
a first power input terminal connected to the second pillar connection electrode.

3. The power module semiconductor device according to claim 1, wherein
the first pillar connection electrode includes a pillar extended electrode disposed on the first pattern.

4. The power module semiconductor device according to claim 1 further comprising
a second semiconductor chip disposed on a third pattern of the first copper plate layer.

5. The power module semiconductor device according to claim 4 further comprising
a second diode disposed on the first pattern so as to be adjacent to the second semiconductor chip.

6. The power module semiconductor device according to claim 5 further comprising
a second pillar electrode disposed on the second semiconductor chip.

7. The power module semiconductor device according to claim 6 further comprising
a second upper surface plate electrode disposed on the second pillar electrode, the second upper surface plate electrode connected to an anode electrode of the second diode.

8. The power module semiconductor device according to claim 7, wherein
the first upper surface plate electrode and the second upper surface plate electrode have curved concave L-shaped structure in an inside corner portion in planar view.

9. The power module semiconductor device according to claim 8 further comprising a second power input terminal connected to the third pattern.

10. The power module semiconductor device according to claim 8 further comprising:
a first group of signal terminals disposed on a first side of the ceramic substrate, the first group of signal terminals connected to the first semiconductor chip via a first group of bonding wires; and
a second group of signal terminals disposed on a second side opposite to the first side of the ceramic substrate, the second group of signal terminals connected to the second semiconductor chip via a second group of bonding wires, wherein
the first group of signal terminals and the second group of signal terminals are alternately disposed with respect to each other.

11. The power module semiconductor device according to claim 10 wherein
the first group of signal terminals and the second group of signal terminals are provided with L-shaped structure.

12. The power module semiconductor device according to claim 11, wherein in planar view observed from a thickness direction of the ceramic substrate,
the first upper surface plate electrode is disposed so as to not cover directly above the first group of bonding wires extended from the first semiconductor chip, and
the second upper surface plate electrode is disposed so as to not cover directly above the second group of bonding wires extended from the second semiconductor chip.

13. The power module semiconductor device according to claim 12, wherein
the first semiconductor chip, the first diode, the first upper surface plate electrode and the first group of signal terminals; and the second semiconductor chip, the second diode, the second upper surface plate electrode and the second group of signal terminals are disposed so as to be symmetric with respect to a point of a center of the ceramic substrate, in planar view observed from a thickness direction of the ceramic substrate.

14. The power module semiconductor device according to claim 7, wherein
the output terminal, the first power input terminal, the first upper surface plate electrode, and the second upper surface plate electrode are disposed so as to be flush with one another.

15. The power module semiconductor device according to claim 9, wherein
at least any one of the first power input terminal, the output terminal, and the second power input terminals has a bent structure.

16. The power module semiconductor device according to claim 10, wherein
the first group of signal terminals and the second group of signal terminals have a structure bent in a thickness direction of the ceramic substrate.

17. The power module semiconductor device according to claim 16, wherein
a plurality of the power module semiconductor devices are disposed in parallel.

18. The power module semiconductor device according to claim 1, wherein
the ceramic substrate is composed of material selected from the group consisting of $Al_2O_3$, AlN, SiN, AlSiC, and SiC of which at least a surface is insulation.

19. The power module semiconductor device according to claim 6, wherein the first pillar electrode and the second pillar electrode are composed of material selected from the group consisting of CuMo, and Cu.

20. The power module semiconductor device according to claim 7, wherein
the first upper surface plate electrode and the second upper surface plate electrode are composed of material selected from the group consisting of CuMo, and Cu.

21. The power module semiconductor device according to claim 1, wherein
the power module semiconductor device is covered with a transfermold resin.

22. The power module semiconductor device according to claim 1, wherein
the semiconductor chip is a power device selected from the group consisting of an SiC based power device, a GaN based power device, and an AlN based power device.

23. The power module semiconductor device according to claim 7, wherein
a plurality of grooves are formed on a surface of at least one side of the first upper surface plate electrode and the second upper surface plate electrode.

24. The power module semiconductor device according to claim 23, wherein
the grooves are guide grooves for guiding the transfermold resin injected into a gap with a jig set so as to cover an outside of a device, at the time of covering the whole device with the transfermold resin.

25. The power module semiconductor device according to claim 24, wherein
the guide grooves include stripe-shaped first grooves formed along an injecting direction of the transfermold resin.

26. The power module semiconductor device according to claim 25, wherein
the guide grooves include second grooves for diffusion configured to diffuse the injected transfermold resin in multiple directions, the guide grooves configured to intersect the stripe-shaped first grooves.

27. The power module semiconductor device according to claim 23, wherein
a projecting portion extended in a direction away from the first upper surface plate electrode and the second upper surface plate electrode is formed on an another side surface of the first upper surface plate electrode and the second upper surface plate electrode.

28. The power module semiconductor device according to claim 23, wherein
the grooves also function as a heat sink at the time of operating the device.

29. The power module semiconductor device according to claim 28, wherein
the groove includes one of a wall and a convexity portion upright adjacent to the groove, and
at least a part of the wall or the convexity portion is exposed to outside from the transfermold resin.

* * * * *